United States Patent
Buckwalter

(10) Patent No.: US 8,258,873 B2
(45) Date of Patent: Sep. 4, 2012

(54) CONSTRUCTIVE FEEDBACK TRAVELING WAVE DEVICE AND METHOD

(75) Inventor: James Buckwalter, San Clemente, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/120,422

(22) PCT Filed: Sep. 24, 2009

(86) PCT No.: PCT/US2009/058172
§ 371 (c)(1),
(2), (4) Date: May 3, 2011

(87) PCT Pub. No.: WO2010/059290
PCT Pub. Date: May 27, 2010

(65) Prior Publication Data
US 2011/0204979 A1    Aug. 25, 2011

Related U.S. Application Data

(60) Provisional application No. 61/099,887, filed on Sep. 24, 2008.

(51) Int. Cl.
*H03F 3/04*    (2006.01)

(52) U.S. Cl. ...................................... 330/291; 330/286
(58) Field of Classification Search .................. 330/291, 330/286, 53–54, 85
See application file for complete search history.

(56) References Cited

U.S. PATENT DOCUMENTS

| 6,342,815 | B1 * | 1/2002 | Kobayashi ................... 330/286 |
| 7,142,052 | B2 | 11/2006 | Zelley |
| 2002/0014920 | A1 | 2/2002 | Ohnishi et al. |
| 2006/0055464 | A1 | 3/2006 | Leyten et al. |

FOREIGN PATENT DOCUMENTS

EP    0600548 A1    6/1994

* cited by examiner

*Primary Examiner* — Hieu Nguyen
(74) *Attorney, Agent, or Firm* — Mintz, Levin, Cohn, Ferris, Glovsky and Popeo, P.C.

(57) ABSTRACT

An apparatus and method include a transmission line carrying a propagating signal between an inlet port and an outlet port. The propagating signal can include a forward traveling wave and optionally a backward traveling wave. A feedback stage samples a the propagating signal at the outlet port, generates a feedback signal the includes a time translation and a gain translation in the feedback energy, and routes the feedback signal to the inlet port such that the gain translation constructively interferes with the forward traveling wave and thereby increases the amplitude of the forward traveling wave.

14 Claims, 22 Drawing Sheets

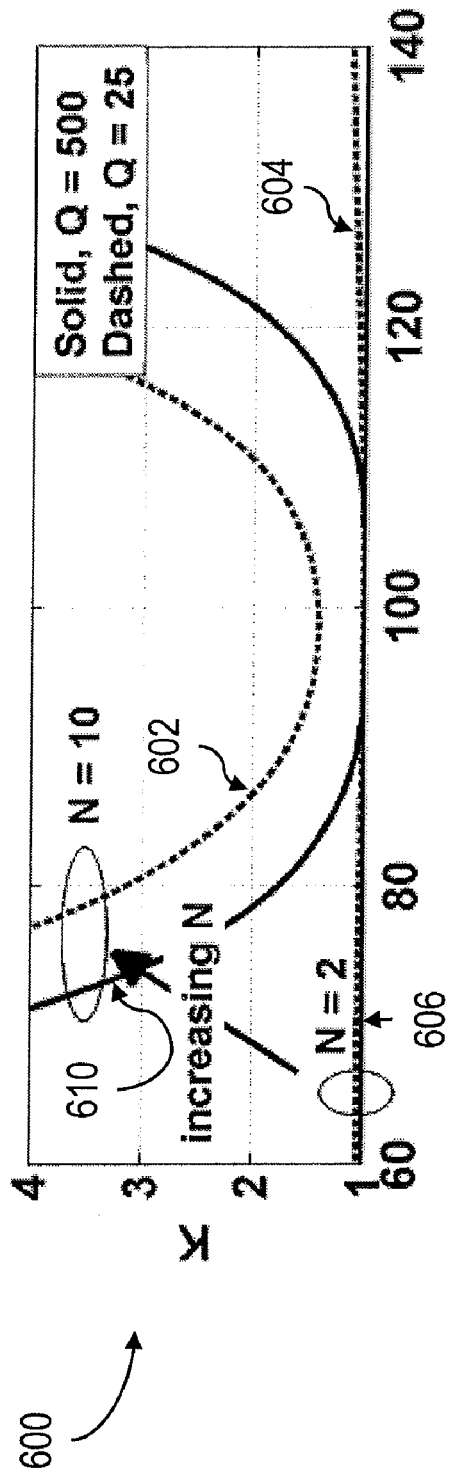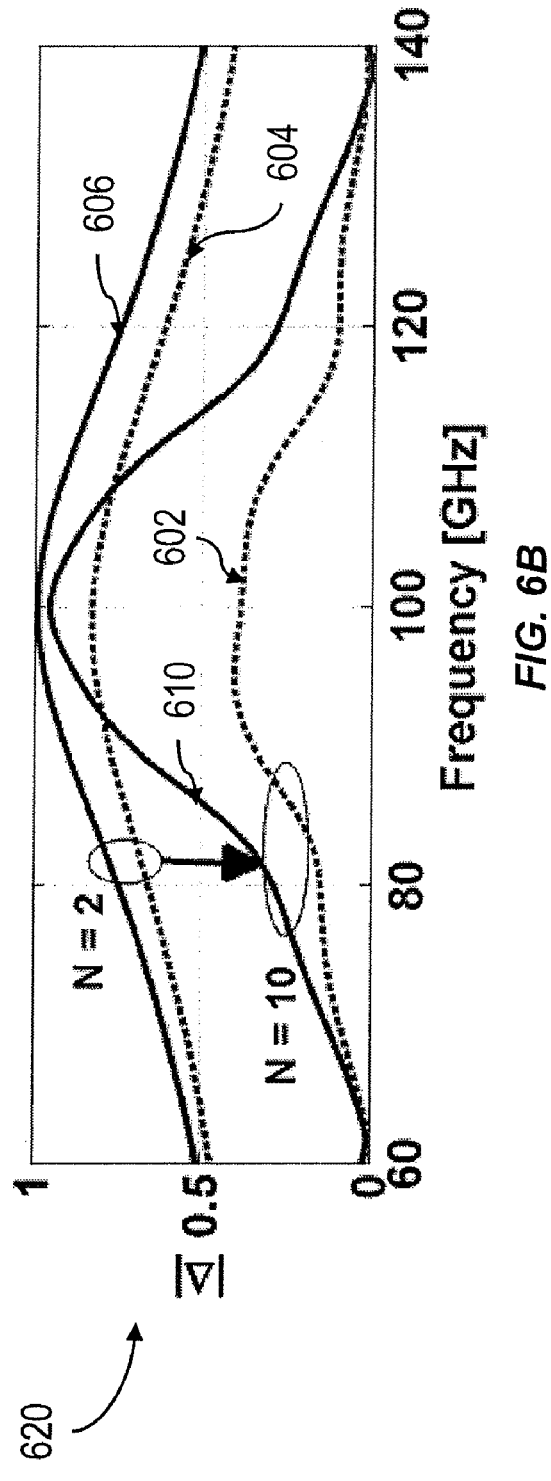
FIG. 6A
FIG. 6B

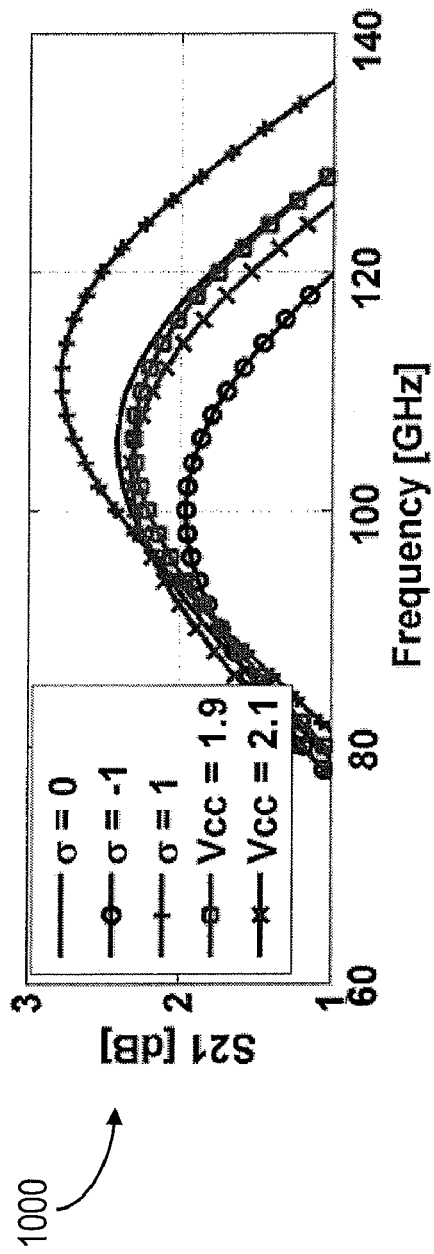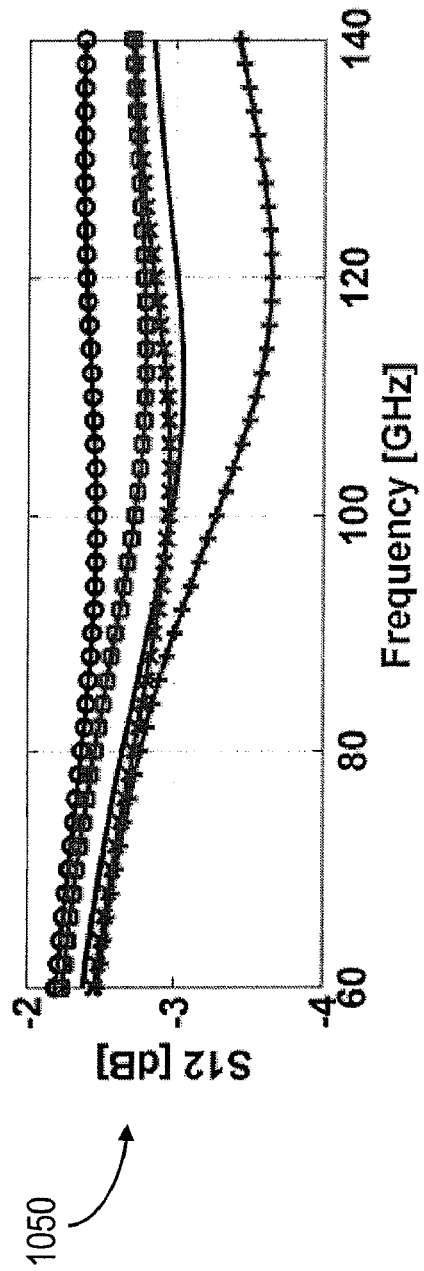
FIG. 10A
FIG. 10B

CONSTRUCTIVE FEEDBACK TRAVELING WAVE DEVICE AND METHOD

CROSS-REFERENCE TO RELATED APPLICATIONS

This application claims the benefit of U.S. provisional patent application Ser. No. 61/099,887, filed on Sep. 24, 2008 and entitled "A Millimeter Wave (MMW) Cascaded Traveling Wave Amplifier Topology for Imaging and Communication Applications," which is incorporated by reference herein in its entirety.

STATEMENT OF GOVERNMENT SPONSORED SUPPORT

Certain aspects of the subject matter described herein was developed with U.S. Government support under Grant No. W911NF-07-1-0460 awarded by DARPA. The U.S. Government has certain rights in the invention.

TECHNICAL FIELD

The subject matter described herein relates to traveling wave circuits that can have amplifying properties.

BACKGROUND

High-frequency and high-speed amplifiers are generally either cascaded or distributed. A cascaded lumped element amplifier can be implemented using narrowband matching elements or broadband matching elements, examples of which are shown in the circuit 100 of FIG. 1A. For cascaded amplifiers, the overall voltage gain, G, is the product of the gain of individual stages. In other words, $G \approx \Pi G_k$ between the input 102 and the output 104 for $k$ stages. Each stage includes a transistor 106 with the transistor gate connected to either the input 102 or the output of a previous stage drain 110. Narrowband matching as in the circuit 100 of FIG. 1A typically allows the highest gain for a given device. A resonant network matches the impedance at the gate, source, or drain of the device to the source and load impedance. These input and output matching networks are well suited to integrated implementations with finite quality factor passives and can alternatively optimize the noise, linearity, or output power of the amplifier stage. However, a drawback of narrowband matching is that the input and output matching are only acceptable over a narrow bandwidth. Additionally, the bandwidth of the amplifier response generally reduces through multiple stages of amplification. For W-band applications, this technique has been preferred to achieve high gain, low noise amplifiers in any solid-state circuit technology.

Feedback techniques such as the shunt resistive feedback circuit 130 of FIG. 1B is capable of wideband matching and gain response. However, resistive shunt feedback inherently reduces the voltage gain of each stage and provides matching determined by the shunt feedback resistance. Additionally, shunt feedback tends to result in higher noise figure due to the addition of the shunt feedback resistance.

An alternative approach for broadband matching and gain is distributed amplification, often referred to as traveling wave amplification, an example of which is shown in the circuit 160 of FIG. 1C. In the example of FIG. 1C, the circuit 160 includes a series of stages that each include an active device 162, such as for example a field effect transistor (FET) or a bipolar junction transistor (BJT). An input transmission line 164 runs from an input 166 to a first impedance termination 170 and an output transmission line 172 runs from a second impedance termination 174 to an output 176. The active device 162 of each stage has its gate or base 180 linked to the input transmission line 164, its drain or collector 182 to the output transmission line 172, and its source or emitter 184 terminated. Other configurations of distributed amplifiers are also possible. In general, a distributed amplifier 160 absorbs the capacitances of the active devices 162 into an artificial transmission line along the input transmission line 164 and output transmission line 172. The input traveling wave propagates along the input transmission line 164, excites the active devices 162 of each stage along the input transmission line 164, and is absorbed into the first impedance termination 170 at the end of the input transmission line 164. In response, two output traveling waves are generated at the drain 182 of each stage; a forward traveling wave that is constructively amplified across multiple stages and an undesired backward traveling wave that is lost in the second termination impedance 174. Combining the output forward traveling wave at each stage results in a lower overall voltage gain than in a cascaded amplifier configuration. The gains of each stage are summed rather than multiplied, so $G \approx \Sigma G_k$ for $k$ stages.

Distributed amplifiers are generally limited by inherent quality factor losses along the gate and drain artificial transmission lines, so typically no more than six to eight stages can be implemented in a conventional distributed amplifier. The achievable gain therefore remains relatively low. However, a distributed amplifier does advantageously provide a desirable broadband gain response accompanying the broadband input and output matching. At millimeter wave frequencies, distributed amplifiers were originally demonstrated with indium-phosphide (InP) and gallium-arsenide (GaAs) technologies. The advance of silicon into millimeter wave regimes has more recently pushed distributed designs into silicon technologies using both n-type metal-oxide-semiconductor (NMOS) devices.

SUMMARY

In one aspect, an apparatus includes a transmission line carrying a propagating signal along a direct path from an inlet port to an outlet port, and a feedback stage that samples the propagating signal at the outlet port, generates a feedback signal that comprises a time translation and a gain translation, and routes the feedback signal to the inlet port. The propagating signal includes a forward traveling wave. The time translation causes the gain translation to constructively interfere with the forward traveling wave, thereby increasing a forward traveling wave amplitude of the forward traveling wave.

In an interrelated aspect, an apparatus includes a first stage and a second stage. The first stage includes a first transmission line carrying a propagating signal along a first direct path from a first inlet port to a first outlet port and a first feedback stage that samples the propagating signal at the first outlet port, generates a first feedback signal that comprises a first time translation and a first gain translation, and routes the first feedback signal to the first inlet port. The propagating signal includes a forward traveling wave. The first time translation causes the first gain translation to constructively interfere with the forward traveling wave, thereby increasing a forward traveling wave amplitude through the first stage. The second stage includes a second transmission line carrying the propagating signal along a second direct path from a second inlet port to a second outlet port, and a second feedback stage that samples the propagating signal at the second outlet port, generates a second feedback signal that comprises a second time translation and a second gain translation, and routes the second feedback signal to the second inlet port. The second inlet port is directly connected to the first outlet port. The second time translation causes the second gain translation to constructively interfere with the forward traveling wave, thereby further increasing the forward traveling wave amplitude through the second stage.

In another interrelated aspect, a method includes receiving, at an outlet port along a transmission line providing a direct path from an inlet port, a propagating signal that includes a forward traveling wave. The method also includes sampling the propagating signal at the outlet port in a feedback stage, generating a feedback signal in the feedback stage, and routing the feedback signal to the inlet port such that the time translation causes the gain translation to constructively interfere with the forward traveling wave, thereby increasing a forward traveling wave amplitude of the forward traveling wave. The feedback signal includes a time translation and a gain translation.

In optional variations of the current subject matter, one or more additional features can be included. Some non-limiting examples of such additional features are described here. The gain translation, $A_v$, can optionally be given by $$A_v = g_m Z_0 / 2$$

where $g_m$ is a transconductance of the feedback stage and $Z_0$ is an impedance of the transmission line, gain translation, $A_v$, can optionally be within a range of 0 to 0.5. The propagating signal can optionally further include a backward traveling wave, and the time translation can cause the gain to destructively interfere with the backward traveling wave, thereby reducing a backward traveling wave amplitude of the backward traveling wave. The feedback signal can optionally further include a frequency translation. The time translation of the feedback signal can optionally introduce a phase shift of approximately a quarter wavelength relative to the forward traveling wave. The transmission line can optionally introduce a first phase shift while the feedback stage introduces a second phase shift that sum to approximately 180 degrees. The first phase shift and the second phase shift can optionally each be in a range of approximately 50 to 130 degrees. The feedback stage can optionally include a common emitter and an emitter follower. The feedback stage can optionally include one or more transistors selected from a common emitter, a common source, an emitter follower, a source follower, a common base, and a common gate.

In another optional aspect, an apparatus can further include a second feedback stage that samples the propagating signal at the inlet port, generates a second feedback signal that comprises a second time translation and a second gain translation, and routes the second feedback signal to the outlet port. The second time translation can cause the gain translation to constructively interfere with a second forward traveling wave of a second propagating signal carried by the transmission line along the direct path from the outlet inlet port to the inlet port, thereby increasing a second forward traveling wave amplitude. A control signal generator can deactivate the feedback stage when the second feedback stage is active and deactivate the second feedback stage when the feedback stage is active.

The current subject matter can provide several advantages while avoiding some of the disadvantages that arise with other amplifier approaches. In an implementation of the current subject matter that functions as an amplifier, an input traveling wave can be amplified as it propagates along a single transmission line with broadband matching such as can be provided by distributed amplifier designs. Stages of such an amplifier can be cascaded to provide multiplicative gain over a passband. Unlike a distributed amplifier, the current subject matter has no inherent limitation, other than power and area limitations, on the feasible number of traveling wave stages that can be cascaded. Each stage can compensate passive losses along the transmission line. The gain response and bandwidth of such an amplifier can fundamentally depend on the feedback gain, which can be electronically controlled. A feedback network can unilaterally amplify a traveling wave along a transmission line. An active feedback path constructively contributes energy to the wave traveling in one direction while at least partially canceling the wave traveling in the opposite direction.

The details of one or more variations of the subject matter described herein are set forth in the accompanying drawings and the description below. Other features and advantages of the subject matter described herein will be apparent from the description and drawings, and from the claims. The following descriptions of several illustrative implementations of the currently disclosed subject matter should not be interpreted to limit the scope of the claims that follow the detailed description.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 6A is a chart showing the stability of an amplifier according to an implementation for a quarter wave transmission line in terms of K;

FIG. 6B is a chart showing the stability of an amplifier according to an implementation for a quarter wave transmission line in terms of $|\Delta|$;

FIG. 10A is a chart showing a spectrum of simulations for process and voltage sensitivity of the S21 wave for an amplifier according to an implementation;

FIG. 10B is a chart showing a spectrum of simulations for process and voltage sensitivity of the S12 wave for an amplifier according to an implementation;

When practical, similar reference numbers denote similar structures, features, or elements.

DETAILED DESCRIPTION

Figure 1A:
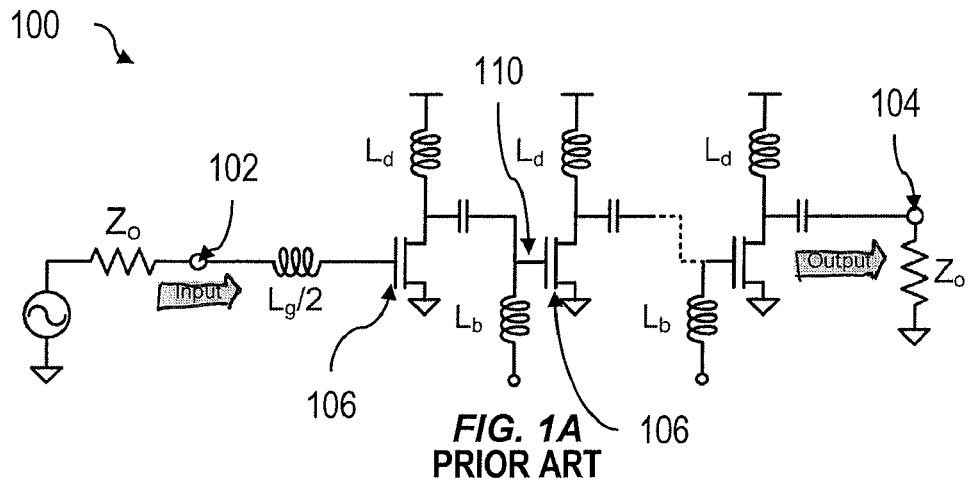
FIG. 1 is three circuit diagrams showing examples of cascaded amplifiers (FIG. 1A and FIG. 1B) and a distributed amplifier (FIG. 1C)
Figure 1B:
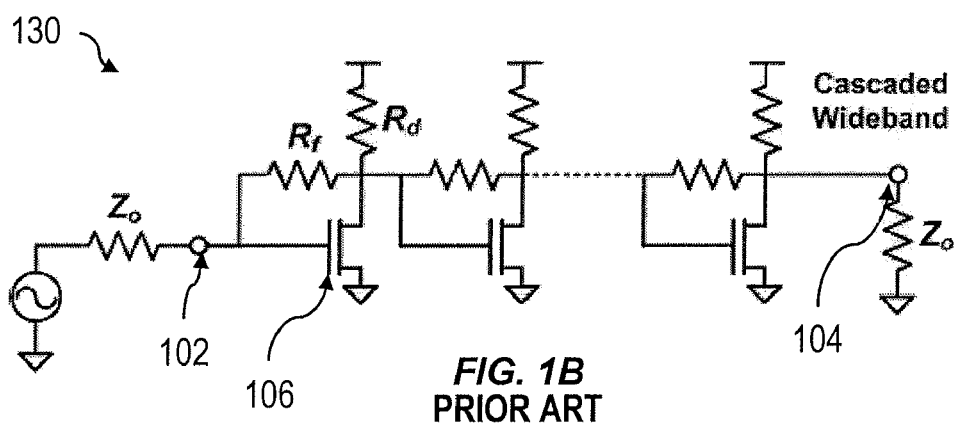
Figure 1C:
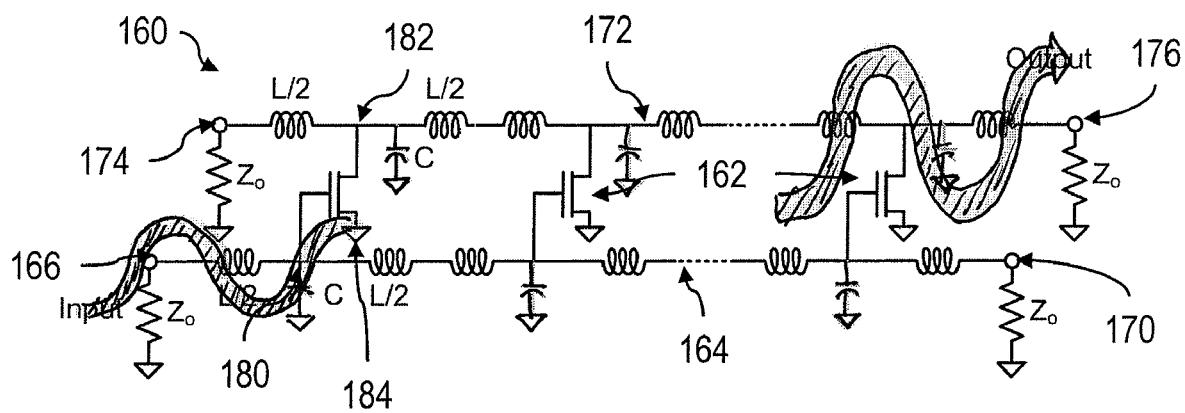

The subject matter described herein relates to constructive feedback circuits that can be used in a number of applications, including but not limited to wide-band, high-gain millimeter wave amplifiers. In some implementations, a cascaded constructive wavefront amplifier hybridizes traveling wave and cascaded amplifier design to offer high gain and wide bandwidth. Although the wide-band, high-gain millimeter wave amplifier is described with respect to imaging and communication applications, other applications of the current subject matter are also within the scope of this disclosure. Moreover, although the description of the wide-band, high-gain millimeter wave amplifier uses the example of a 26 dB, 100 Gigahertz (GHz) wide-band, high-gain millimeter wave amplifier, this implementation is exemplary.

The millimeter-wave (mm-wave) frequency regime offers growing opportunities for silicon integrated circuits in communication, radar, and imaging applications. Traditionally, W-band (75-111 GHz) circuits have relied on GaAs or InP devices, but recent work demonstrates silicon front-ends for W-band imaging and communications in spite of the low intrinsic bandwidth of silicon devices. The availability of W-band silicon integrated circuits could realize medical and security imaging through active and passive imaging arrays. At millimeter-wave frequencies, new challenges exist for silicon wideband circuits. Circuit designers are confronted by concerns of process variations as well as the low quality factor of passives as the emphasis is on employing high-frequency circuits into monolithic arrays.

According to some implementations of the current subject matter, a traveling wave stage enables waves to be propagated from the left-to-right, the forward direction, or right-to-left, the backward direction through a system that includes a transmission line that is fainted by linking the output of a successive constructive feedback stage to the output of a preceding constructive feedback stage. The feedback stage can in some examples include one, or in other examples, two or more transistors ($Q1$ and $Q2$) that cause a travel delay on the feedback path such that the amplitude of the forward wave is increased while the amplitude of the backward wave is reduced. The feedback stage thus generates a feedback signal that includes a time translation and a gain translation. The time translation is advantageously selected such that the gain translation constructively interferes with a forward traveling wave on the transmission line when the feedback signal is routed back to the beginning of the stage. The amount of amplification per stage can be relatively small to prevent oscillation and maintain stability. However, a very large number of stages can be cascaded to provide very high overall gain across a relatively wide frequency band. In some implementations, the feedback stage can also add a frequency translation to add frequency mixing or multiplying (i.e. doubling, tripling, etc.) functionality to a device.

Figure 2:
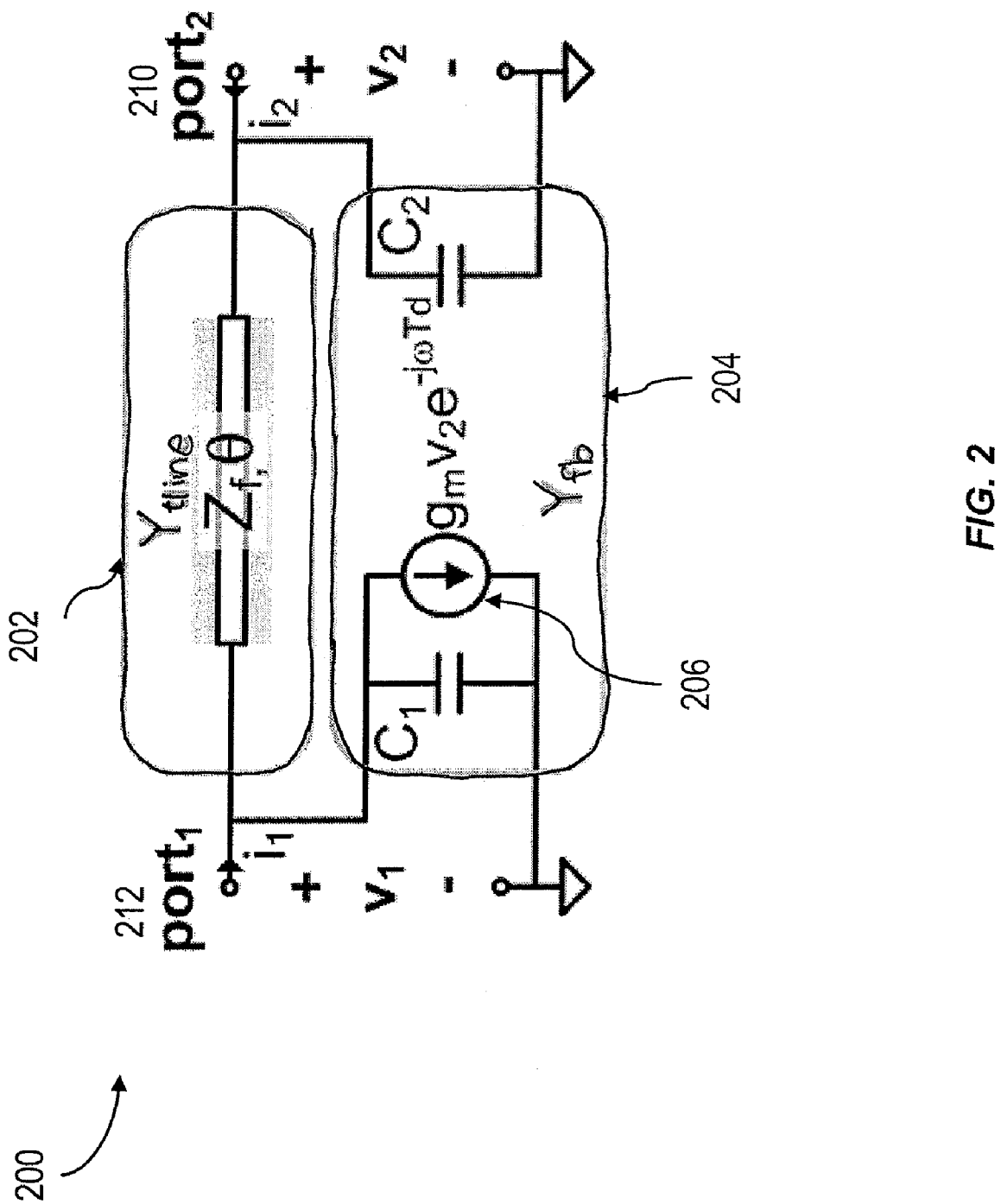
FIG. 2 is a circuit diagram showing a stage of an amplifier according to an implementation.

In some implementations, an individual stage 200, which can be part of a cascade of shunt-shunt feedback stages, is created across a transmission line 202 as shown in FIG. 2. For this shunt-shunt interconnection, Y-parameters of the transmission line 202 and a feedback path or stage 204 can be analyzed separately and combined to determine the response of a single stage. The general Y-parameters for a transmission line 202 through a stage 200 are as follows:

$$Y_{tline} = \begin{bmatrix} Y_f \coth(\gamma l) & -Y_f \operatorname{csch}(\gamma l) \\ -Y_f \operatorname{csch}(\gamma l) & Y_f \coth(\gamma l) \end{bmatrix}, \quad (1)$$

where $\gamma = a + j\beta$ is the propagation constant that includes the attenuation and phase constant along a transmission line 202 having length, l, with a characteristic admittance of $Y_f$.

One or more active devices are part of the feedback path or stage 204. These active devices form a transconductor amplifier 206 in the shunt-shunt feedback network to sample the output of the stage 200 at an output (port 2) 210 and feed current back to an input port (port 1) 212 of the stage 200 via the feedback path 204. The feedback path admittance, $Y_{fb}$, of the transconductor amplifier 206 is represented mathematically as $$Y_{fb} = \begin{bmatrix} sC_1 & g_m e^{-sT_d} \\ 0 & sC_2 \end{bmatrix}. \quad (2)$$

Here, the transconductance is $g_m$ while $C_1$ and $C_2$ are the input and output capacitive loading of the feedback contributed by the active devices that make up the transconductor amplifier 206. A time delay, or more generally a time translation, $T_d$, through the feedback path or stage 204 corresponds with some fraction of the finite transit time of the active device 206 but could be alternatively considered as a frequency-dependent delay through the feedback path 204. The admittance response, $Y_{stage}$, of a single stage 200 can be determined by summing the admittance, $Y_{tline}$, of the transmission line 202 from equation (1) and the admittance, $Y_{fb}$, of the feedback path 204 from equation (2). The mathematical representation of the combined linear behavior of the transmission line and active feedback signal are represented from the linear combination of these constituent parts as follows:

$$Y_{stage} = \begin{bmatrix} sC_1 + Y_f\coth(\gamma l) & g_m e^{-sT_d} - Y_f\operatorname{csch}(\gamma l) \\ -Y_f\operatorname{csch}(\gamma l) & sC_2 + Y_f\coth(\gamma l) \end{bmatrix}. \quad (3)$$

Figure 3:
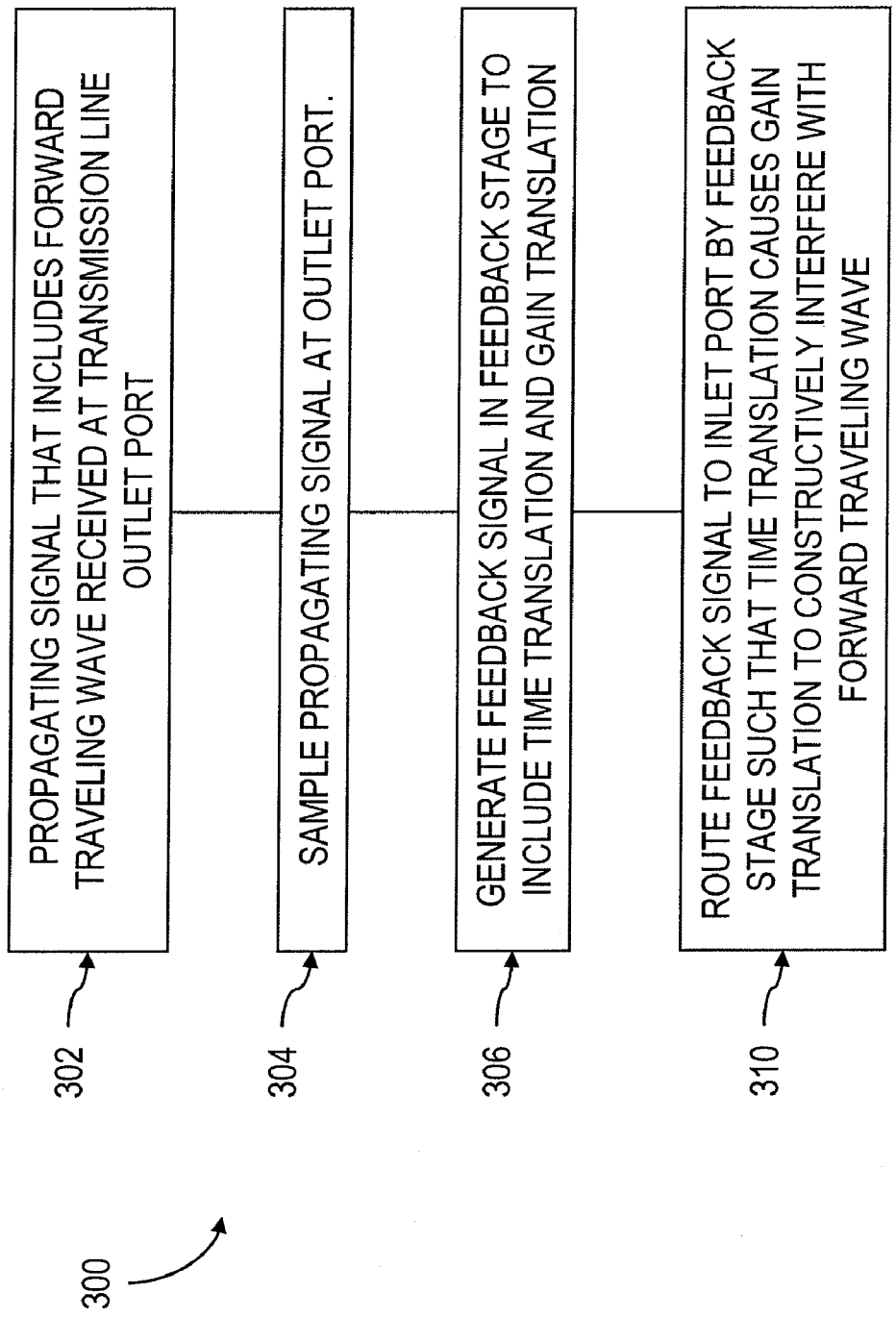
FIG. 3 is a process flow chart illustrating a method according to an implementation.

FIG. 3 shows a process flow chart 300 illustrating a method according to an implementation of the current subject matter. At 302, a propagating signal that includes a forward traveling wave is received at a transmission line outlet port, such as port 210. At 304, the propagating signal is sampled at the outlet port 210 by a feedback stage 204. A feedback signal is generated in the feedback stage at 306 to include a time translation and a gain translation. At 310, the feedback signal is routed to the inlet port by the feedback stage such that the time translation causes the gain translation to constructively interfere with the forward traveling wave, thereby increasing a forward traveling wave amplitude of the forward traveling wave. The propagating signal can also include a backward traveling wave with which the gain translation to destructively interferes to thereby decrease a backward traveling wave amplitude of the backward traveling wave. The feedback stage and the transmission line can introduce a first and a second phase shift, respectively. In some implementations, the sum of the first and the second phase shifts can advantageously be approximately $\pi$ radians or 180 degrees such that the gain translation of the feedback signal is coherently added to the forward traveling wave and coherently subtracted from the reverse traveling wave. While coherent addition and/or subtraction is optimized at 180 degrees, the constructive and/or destructive interference need not be perfect according to the current subject matter. Real devices can include additional impedances, capacitances, and the like that can modify time or frequency translations from modeled values. Such devices are also within the scope of the current subject matter.

To simplify the following illustrative derivations, the transmission line 202 is first assumed to be lossless ($\alpha=0$), while the transmission line impedance is assumed to be equal to the source and load impedance, ($Y_f=Y_0$), and the input and output capacitive loading of the feedback path 204 is ignored, ($C_1=0$ and $C_2=0$) unless otherwise stated. These assumptions allow general analysis of the mechanism of constructive wave amplification for an implementation of the current subject matter. In this analysis, the wave transmission and reflection for a single stage 200 are determined through conversion of the Y-parameters in equation (3) into S-parameters of a two by two $|S|$ scattering matrix: according to the following equations:

$$S_{11} = S_{22} = \frac{-A_\upsilon e^{-j(\omega T_d + \theta)}}{1 + \alpha l + A_\upsilon e^{-j(\omega T_d + \theta)}}, \quad (4a)$$

$$S_{21} = \frac{1}{1 + \alpha l + A_\upsilon e^{-j(\omega T_d + \theta)}}, \text{ and} \quad (4b)$$

$$S_{12} = \frac{e^{-j\theta} - A_\upsilon e^{-j\omega T_d}(1 + \alpha l - (1-\alpha l)e^{-j2\theta})}{1 + \alpha l + A_\upsilon e^{-j(\omega T_d + \theta)}} \quad (4c)$$

where the feedback voltage gain, or more generally the gain translation, $A_\upsilon$ is given by $$A_\upsilon = g_m Z_0/2. \quad (5)$$

Ignoring the impact of transmission line losses ($\alpha=0$), the magnitude of each $|S|$ scattering matrix element is given by the following equations:

$$|S_{11}| = |S_{22}| = \frac{A_\upsilon}{\sqrt{1 + A_\upsilon^2 + 2A_\upsilon\cos(\theta + \omega T_d)}}, \quad (5a)$$

$$|S_{21}| = \frac{1}{\sqrt{1 + A_\upsilon^2 + 2A_\upsilon\cos(\theta + \omega T_d)}}, \text{ and} \quad (5b)$$

$$|S_{12}| = \frac{\sqrt{1 + 4A_\upsilon^2\sin^2(\theta) - 4A_\upsilon\sin(\theta)\sin(\omega T_d)}}{\sqrt{1 + A_\upsilon^2 + 2A_\upsilon\cos(\theta + \omega T_d)}}. \quad (5c)$$

From this first-order analysis, the S-parameters depend on the voltage gain through the shunt feedback path 204 as well as the phase, $\theta$, through the transmission line 202 and delay, $T_d$, through the feedback path 204. Constructive interference or coherent addition occurs when the transconductor amplifier 206 coherently adds energy to the forward traveling wave and provides forward gain. Concurrently, destructive interference or coherent subtraction occurs when the transconductor amplifier 206 absorbs energy of the backward traveling wave, reducing the wave amplitude. From equation (5b) and equation (5c), the conditions on the transmission line phase, $\theta$, and feedback delay, $T_d$, are as follows:

$$\theta + \omega T_d = \pi \quad \theta - \omega T_d = 0 \quad (6)$$

In other words, the phase through the transmission line 202 and the feedback path 204 are advantageously offset by $\pi/2$ radians or 90° at the amplifier center frequency. Under this phase condition, the $|S|$ scattering matrix reduces to the following equation:

$$|S| = \begin{bmatrix} \dfrac{A_\upsilon}{1-A_\upsilon} & \dfrac{1-2A_\upsilon}{1-A_\upsilon} \\ \dfrac{1}{1-A_\upsilon} & \dfrac{A_\upsilon}{1-A_\upsilon} \end{bmatrix}. \quad (7)$$

According to equation (7), the maximum single stage gain is $G_{ss} = (1-A_\upsilon)^{-1}$. The backward transmission, S12, is cancelled completely if $A_\upsilon = \frac{1}{2}$ while the forward transmission, S21, is 2. Hence, the forward wave is amplified while providing isolation of the backward traveling wave. The phase conditions in equation (6) and resulting S-parameters in equation (7) indicate that the stage amplifies through positive feedback of the wave from the output to the input of the stage. However, the input and output return loss, S11 and S22, are equal to 1 for $A_\upsilon = \frac{1}{2}$, thereby making smaller values of $A_\upsilon$ more desirable In the limit that the feedback voltage gain approaches zero, the response in equation (7) resembles an ideal lossless transmission line.

As a further illustration of an implementation of the current subject matter, a 100 GHz center frequency is analyzed for a cascaded constructive traveling wave amplifier according to the current subject matter. Consequently, the wavelength, λ, is 3 mm, and because $\omega_0 T_d = \theta = \pi/2$, the delay time, $T_d$, through the feedback path 204 is 2.5 ps. The S-parameters are plotted in the chart 400 of FIG. 4 for $g_m=10$ mS, which per equation (5) equates to $A_v=\frac{1}{4}$, under transmission line impedance ($Z_f$) of 50Ω (solid lines) and 45Ω (dashed lines). The forward transmission for $Z_f=50\Omega$ has a maximum of 2.2 dB at the center frequency of 100 GHz, while the backward transmission has a minimum of −4 dB. With no capacitive loading per the assumption noted above, the input and output return loss is identical, i.e. S11=S22, and decreases to 9.5 dB. For $Z_f=45$, S21 does not change appreciably while S12 increases to −2.5 dB. The primary benefit of reducing the characteristic impedance of the transmission line 202 is a reduction of S11 and S22 to −14 dB across the entire frequency range. Notably, the matching of the amplifier stage 200 is wideband over the entire 80 GHz of frequency that is graphed in the chart 400 of FIG. 4. As discussed in greater detail below, the matching is also broadband and independent of the center frequency of the amplifier response. This advantage is not typical of cascaded lumped element amplifier designs where matching networks are inherently narrowband.

From the S-parameter analysis, the 3 dB bandwidth, BW, of S21 for a single stage 200 is calculated from equation (5b) as follows:

$$BW = 2f_o\left(1 - \frac{1}{\pi}\arccos\left(\frac{1}{2A_v} + \frac{A_v}{2} - 2\right)\right) \quad (8)$$

Figure 5:
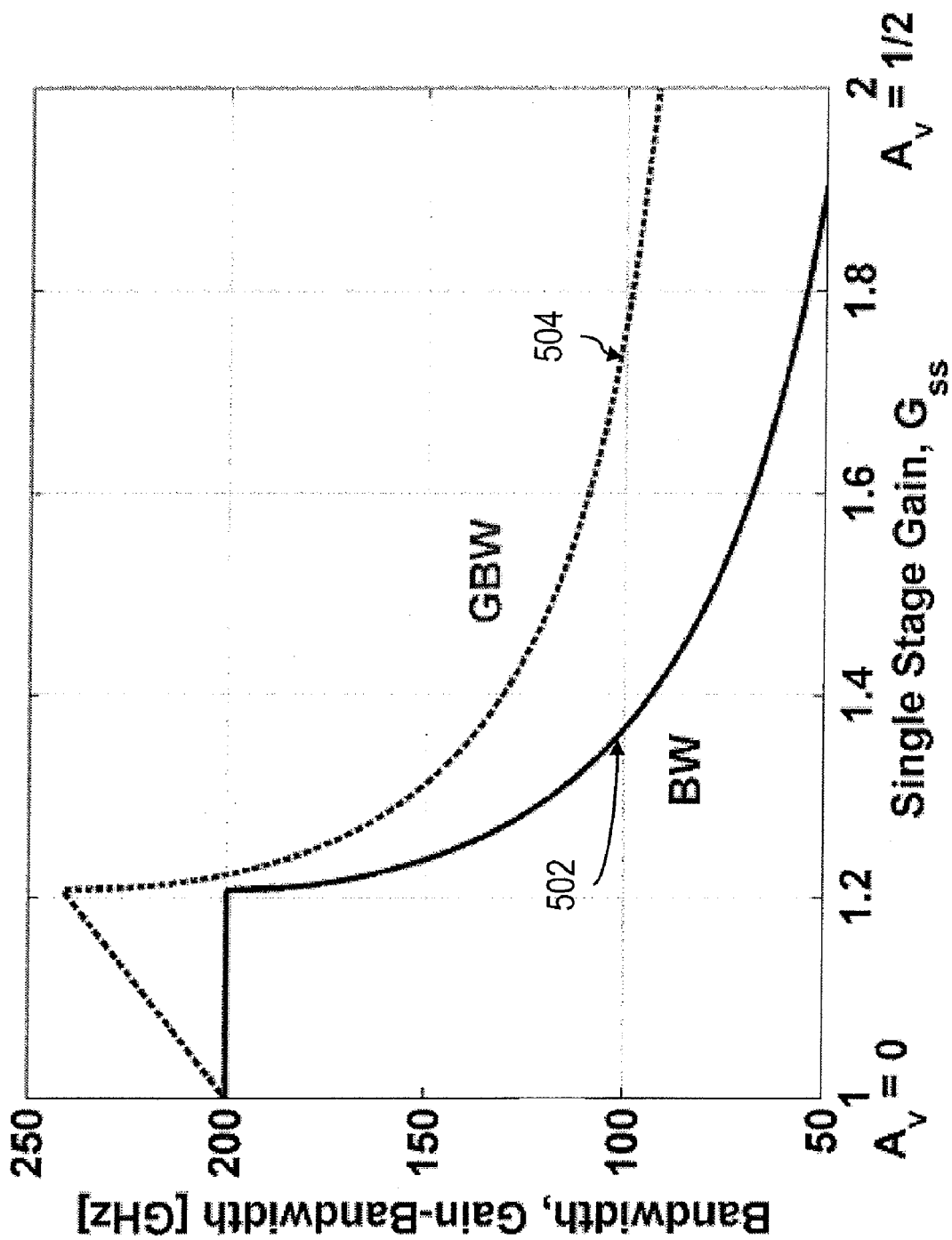
FIG. 5 is a chart showing analytical results for dependence of bandwidth and the gain-bandwidth product on the amplifier gain for a single stage.

The feedback voltage gain determines the 3 dB bandwidth around the center frequency, $f_0$. The bandwidth 502 and the gain-bandwidth product, GBW 504, as a function of the gain, $G_{ss}$, of the single stage 200 is plotted in the chart 500 of FIG. 5. As shown, the bandwidth, BW 502, decreases as $G_{ss}$ increases. This trend holds in the limit that the transmission line cutoff frequency is large, in this case, twice the center frequency or $2f_0$, compared to the center frequency of the amplifier. The maximum gain-bandwidth occurs when the magnitude of the arccosine argument is less than unity and is achieved for $A_v=0:17$, providing a single stage gain of 1.2. After $G_{ss}$ reaches approximately 1.2, the bandwidth and, consequently, gain-bandwidth roll-off.

A substantive difference between constructive wave behavior and traditional cascaded amplifiers is the feature that the bandwidth in a constructive wave device, according to some implementations of the current subject matter, tends to approach the cut-off frequency of the transmission line 202 at low gain values since the traveling wave stage degenerates to a simple transmission line when the feedback gain is eliminated. Because the gain of the stage, $G_{ss}$, depends on the voltage feedback gain, $A_v$, per equation (7), and the bandwidth depends on the voltage feedback gain, $A_v$, per equation (8), the single stage gain, $G_{ss}$, and bandwidth, BW, can be electronically controlled. Since gain, $G_{ss}$, depends on the transconductance, $g_m$, in the feedback path 204, the feedback gain, $A_v$, can be controlled through current biasing of the stage.

Figure 4:
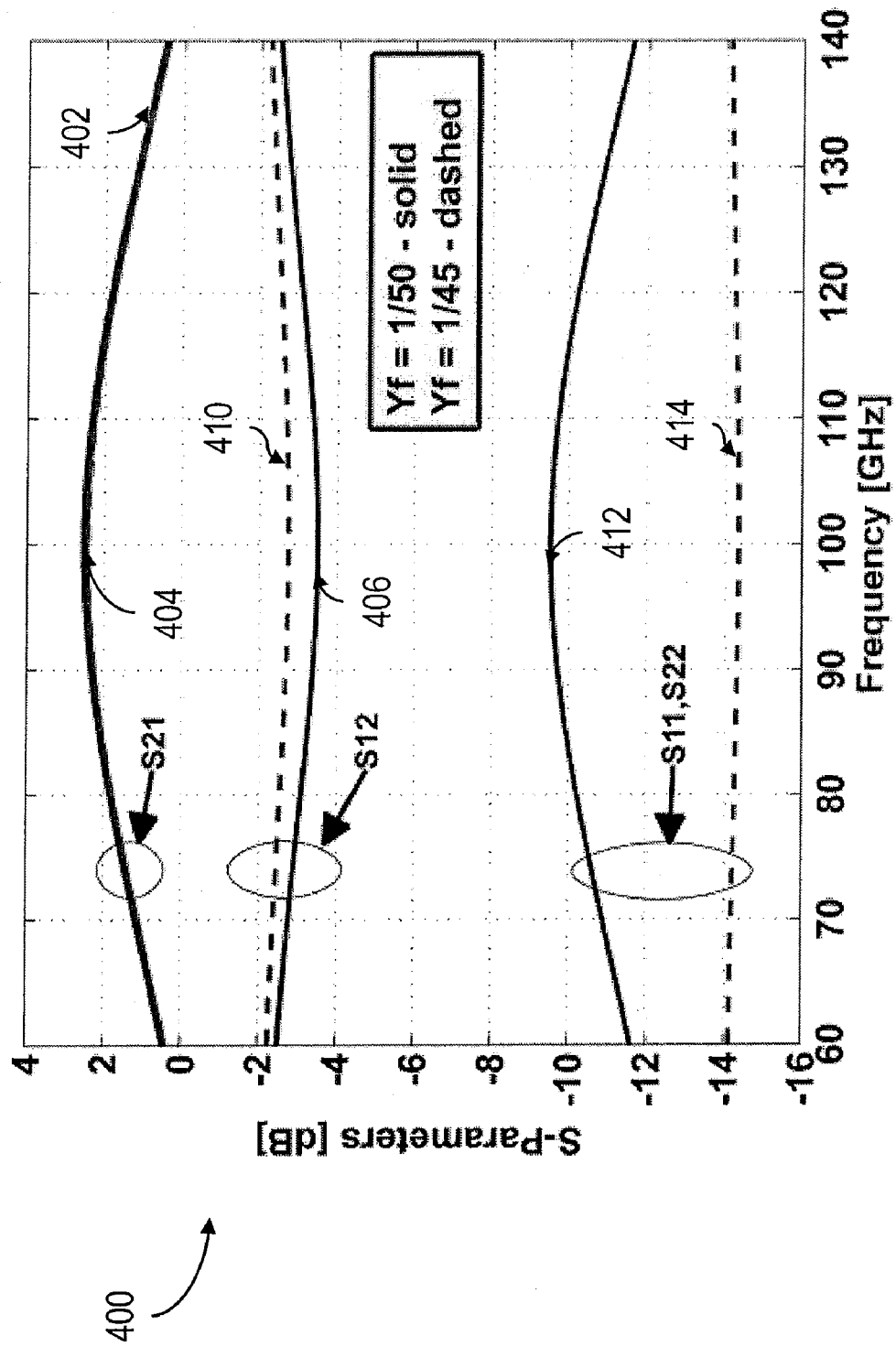
FIG. 4 is a chart showing S-parameters for a single stage of an amplifier according to an implementation with transconductance (gm) of 10 mS, a phase ($\theta$) of 90 degrees ($\pi/2$) and a delay time in the feedback path of (Td)

Another notable feature of a constructive wave stage, according to implementations of the current subject matter, is wideband impedance matching reflected in the return loss shown in the chart 400 of FIG. 4. The forward transmission coefficient, S21 (solid line 402 for $Z_f=50\Omega$ and dashed line 404 for $Z_f=45\Omega$), peaks at the target frequency of 100 GHz, but shows wideband positive response. The reverse transmission coefficient, S12 (solid line 406 for $Z_f=50\Omega$ and dashed line 410 for $Z_f=45\Omega$) is largely flat over the frequency range shown. The input and output reflection coefficients, S11 and S22 (solid line 412 for $Z_f=50\Omega$ and dashed line 414 for $Z_f=45\Omega$), are both below −10 db for the entirety of the frequency range shown at both values of $Z_f$.

The input and output admittances, $Y_{in}$ and $Y_{out}$, are determined from equation (3) as follows:

$$Y_{in} = Y_{11} - \frac{Y_{12}Y_{21}}{Y_{22} + Y_o} = Y_o(1 + 2A_v e^{-j(\omega T_d + \theta)}) \text{ and} \quad (9a)$$

$$Y_{out} = Y_{22} - \frac{Y_{12}Y_{21}}{Y_{11} + Y_o} = Y_o(1 + 2A_v e^{-j(\omega T_d + \theta)}), \quad (9b)$$

where the source and load impedances for the single stage are $Y_0$. The input and output impedances are identical when Y11=Y22. Both the input and output admittance trace a circle of radius $1+2A_v$ on a Smith chart around $Y_0$. The matching is improved by reducing the voltage feedback gain, $A_v$, and a fundamental tradeoff occurs between the desired matching and the maximum achievable single stage gain. Consequently, a design strategy for a constructive cascading wave amplifier according to an implementation of the current subject matter can be to achieve an acceptable input and output return loss for a given stage and cascade multiple sections to achieve the overall desired value of gain.

The trade-off between gain and matching is common to all linear amplifiers and is theoretically governed by the Bode-Fano limit. For a shunt RC load impedance, the Bode-Fano limit is determined as follows:

$$\int_0^\infty \ln\left|\frac{1}{\Gamma(\omega)}\right| d\omega \leq \frac{\pi}{RC} \quad (10)$$

where $\Gamma(\omega)$ is the reflection coefficient of the matching network. In any amplifier stage, the matching bandwidth can be limited by the inherent capacitance of the active device, $C=g_m/\omega_T$, where $\omega_T$ is the unity gain transition frequency of the device. For a cascaded amplifier, the right-hand side of the inequality in equation (10) can be found by substituting this inherent capacitance subject to input and output matching to $Z_0=50\Omega$ at the center frequency. Consequently, the limit of inequality in equation (10) is $\pi\omega_T/G_{ss}$, where $G_{ss}=g_m Z_0$ is the single stage gain for the lumped element amplifier. The matching bandwidth for the lumped element amplifier necessarily decreases proportionally with increasing gain. In the case of resonant matching networks, additional elements can be introduced to the matching network to provide a bandwidth enhancement. The limit of inequality in equation (10) can double to $2\pi\omega_T/G_{ss}$ with a one-port matching element, such as a shunt inductance added to the shunt RC load, and quadruples for a two-port matching network, such as a series inductance.

The active device, in techniques according to the current subject matter, is advantageously in the feedback network and, as has been shown, the single stage gain is $G_{ss}=(1-g_m Z_0/2)^{-1}$. Substituting the transconductor device capacitance with input and output matching to 50Ω, the right hand side of the inequality in equation (10) is $\pi\omega_T/2(1-G_{ss}^{-1})$. To determine the conditions under which a constructive cascading wave amplifier according to an implementation of the current subject matter can provide improved matching, the Bode-Fano limit can be compared for a lumped element amplifier with a shunt inductance to resonate the device capacitance. For a single stage, the following relation must hold to demonstrates a higher Bode-Fano bound and therefore superior implementation compared with the conventional cascade:

$$\frac{2\pi\omega_T}{G_{ss}} \leq \frac{\pi\omega_T}{2(1-G_{ss}^{-1})} \quad (11)$$

Solving for the single stage gain, for all $G_{ss}$, the current subject matter offers a higher Bode-Fano limit and, consequently, matching than currently available devices and techniques. Equation (11) holds for $G_{ss}$=2. As discussed above with respect to bandwidth, the matching limit of devices according to the current subject matter can increase to the intrinsic matching of the feedforward transmission line 202 as the voltage feedback gain, $A_v$, approaches zero.

The capacitances, C1 and C2, associated with the transconductor amplifier 206 have been ignored in this analysis to ease understanding of the S-parameters of a single stage. Capacitive loading generally lowers the impedance of the transmission line 202 and decreases the electrical length of the transmission line 202. The effective phase, $\theta_{eff}$, of a transmission line 202 of length $\theta$ is given by the following equation:

$$\theta_{eff} = \arctan\left(\frac{-\omega\tau\cos\theta + \left(\frac{1}{2}(\omega\tau)^2 - 1\right)\sin\theta}{\cos\theta - \omega\tau\sin\theta}\right), \quad (12)$$

where the capacitance at the input port 212 and output port 210 are assumed to be equal, C=C1=C2 and to define the time constant at the input and output nodes, $\tau=CZ_0$. When the capacitive loading is small, the effective phase, $\theta_{eff}$, approaches $\theta$. From equation (12), the effective phase and group delay are determined to accurately determine the feedforward transmission line length, l.

The chain matrix representation of a single stage can be employed to study the interaction of a cascade of uniform stages. Converting equation (3) into a chain matrix under the assumptions noted above, the ABCD chain matrix for each stage is as follows:

$$T_{stage} = \begin{bmatrix} \cosh(\gamma l) & Z_f \sinh(\gamma l) \\ \frac{1}{Z_f}\sinh(\gamma l) + g_m e^{-j\omega T_d} & \cosh(\gamma l) \end{bmatrix} \quad (13)$$

The chain matrix determines features of the cascaded constructive traveling wave stages to amplify the forward traveling wave and isolate the backward traveling wave over multiple stages.

A cascade of N traveling wave stages can be analyzed using chain matrix multiplication according to the following equation:

$$T_{amp} = T_{stage}^N \quad (14)$$

While straightforward substitution of equation (13) into equation (14) does not provide simple analytical results, the expression is manageable numerically. For the phase condition $\theta = \omega_0 T_d = \pi/4$, the interaction of the stages leads to slightly different behavior for odd and even numbers of stages and the resulting cascaded gain in the forward direction can be represented as follows:

$$|S_{21}| = \begin{cases} G_{ss} G_{cs}^{N-1/2} & \text{if } N \text{ odd} \\ G_{cs}^{N/2} & \text{if } N \text{ even,} \end{cases} \quad (15)$$

where the composite gain of two stages is $G_{cs}=(1-2A_v)^{-1}$ and differs from the single stage gain, $G_{ss}=(1-A_v)^{-1}$. The earlier condition on the feedback voltage gain in equation (5b), $A_v<\frac{1}{2}$, extends to the cascade for stability. From equation (15), an even number of stages can produce a slightly higher overall gain per stage compared to an odd number of stages. Notably, this demonstrates that the implementation is a traveling wave amplifier and has cascaded (i.e. multiplicative) gain, a property not possessed by approaches in the prior art.

The stability characteristics of a single stage can be important in ensuring the stability of a cascade of stages to attain higher total gains. The Rollett stability criteria, Ks, and, $\Delta$, are necessary and sufficient to assess the unconditional stability of amplifier stages and can be determined from the S-parameters as follows:

$$K_s = \frac{1 - |S_{11}|^2 - |S_{22}|^2 + |\Delta|^2}{2|S_{21}S_{12}|}, \text{ and} \quad (16a)$$

$$\Delta = S_{11}S_{22} - S_{12}S_{21}, \quad (16b)$$

where $K_s>1$ and $|\Delta|<1$ can be completely sufficient conditions for unconditional amplifier stability. To maintain unconditional stability, $|S_{21}S_{12}|$ should be generally less than unity. From FIG. 4, S21 and S12 will theoretically obey this condition. Analytical results for the stability of a single amplifier stage can be reached by substituting equation (4a), equation (4b) and equation (4c) into equation (16a). The stability margins can be smallest near the center frequency of the amplifier. In other words, $\theta=\omega_0 T_d=\pi/2$, and the criteria in equation (16a) and equation (16b) can be reduced to the following:

$$K_s = \frac{1 + \alpha l(1 - A_v) - 2A_v}{1 - (\alpha l)^2 - 2A_v}, \text{ and} \quad (17a)$$

$$\Delta = \frac{(1 - A_v)^2 - (\alpha l)^2}{(1 + \alpha l - A_v)^2}. \quad (17b)$$

These expressions include the transmission line loss, al, to illustrate the potential effect of this loss on the stability criteria. First, for a lossless transmission line case, $\alpha=0$. From equation (17a) and equation (17b), both stability criteria $K_s$ and $|\Delta|$ are identically $K_s=1$ and $|\Delta|=1$, and can be independent of $A_v$. When $A_v=0$, the stage degenerates to a lossless transmission line. Under the conditions $0<A_v<\frac{1}{2}$, the stability criteria do not change because the input/output return loss and forward/backward transmission cancel and a single stage 200 can have similar behavior to a lossless transmission line. Another perspective on the local stability can be obtained by consider a short at either the input port 212 or output port 210 in FIG. 2. If the short is placed at the input port 212, the feedback voltage gain can be nulled since the feedback current is shunted at the input port 212. If the short is placed at the output port 210, the feedback voltage gain can again be nulled because the input of the transconductor amplifier 206 is shorted.

When transmission line losses are introduced, the stability can be generally improved because the loss through the feedforward transmission reduces the magnitude of all of the S-parameters from equation (4a), equation (4b), and equation (4c). In equation (17a), the loss reduces the denominator of $K_s$ while increasing the numerator. Similarly, the loss term reduces the numerator of equation (17b) while increasing the denominator. Consequently, practical losses in the feedforward transmission can in some instances guarantee unconditional stability of the circuit. Differentiating equation (17a) determines the sensitivity of the local stability criteria to feedback gain variation as follows:

$$\frac{\partial K_s}{\partial A_U} = \frac{\alpha l + 2(\alpha l)^2 - (\alpha l)^3}{1 - (\alpha l)^2 - 2A_U} > 0. \quad (18)$$

The Rollett stability criteria is shown in equation (18) to be extremely insensitive to the voltage feedback gain, $A_v$. For small transmission line losses, $K_s$ generally improves with additional gain. However, the denominator becomes negative once the feedback voltage gain exceeds one-half ($A_v > \frac{1}{2}$), and changes in the gain can result in potential instability.

The analysis of local stability for a single stage 200 discussed above can be extended to examine global stability across N stages terminated with a source and load impedance of $Z_0$. Based on the chain matrix parameters in equation (14), the stability for cascaded stages produces the same stability criteria as the single stage at the center frequency: $K_s=1$ and $|\Delta|=1$.

To observe the stability for multiple stages around the center frequency, $K_s$ and $|\Delta|$ are plotted in the charts 600 and 620 of FIG. 6A and FIG. 6B, respectively based on analytical expressions derived from equation (13) under lossless and lossy transmission line condition where the transmission line 202 quality factor, $Q$, is determined as $Q=\beta/2\alpha$, where $\beta$ is the phase constant along the transmission line and $\alpha$ is the attenuation constant along the transmission line. The stability criteria are plotted for N=2 (dashed lines 602 and 604) and N=10 (solid lines 606 and 610) for two values of the quality factor, $Q$. The amplifier cascade in this example is clearly unconditionally stable with two stages. The $K_s$ is analytically guaranteed to be at least unity and $|\Delta|$ is at most unity over all frequencies. With an increasing number of stages, the amplifier stability margins are improved at offsets from the center frequency and is minimum at the center frequency regardless of the number of stages. When a lossy transmission line is introduced, the stability of the cascade is generally further improved because the losses maintain the stability margins over multiple stages. As shown in FIG. 6A and FIG. 6B, the stability margins improve for a given quality factor, $Q$, as the number of stages increase. Consequently, a long cascade of stages 200 according to the current subject matter can enhance unconditional global stability without sacrificing significant gain.

An additional consideration for cascaded constructive wave amplifiers according to implementations of the current subject matter is the noise factor of the cascade of constructive wave amplifier stages 200. The noise factor, F, of a cascade of N identical single amplifier stages each with a noise figure, $F_{ss}$, and voltage gain, $G_{ss}$, is determined as follows:

$$F = 1 + (F_{ss} - 1)\frac{1 - G_{ss}^{-2N}}{1 - G_{ss}^{-2}}. \quad (19)$$

Assuming that the overall cascaded gain, $G=G^N_{ss}$, is high, the noise factor, F, is defined approximately as follows:

$$F \approx 1 + (F_{ss} - 1)\frac{G_{ss}^2}{G_{ss}^2 - 1} = \frac{F_{ss}G_{ss}^2 - 1}{G_{ss}^2 - 1}. \quad (20)$$

To meet the simultaneous matching requirements and the maximum gain per stage, the single stage gain in this example is roughly $G_{ss}=1:33$. The minimum noise figure for a HBT in a 0.12 μm SiGe BiCMOS is roughly 6 dB at 100 GHz. Consequently, the anticipated noise figure, F, for an infinite cascade of traveling wave stages is around 8.9 dB or equivalently a 3 dB noise figure penalty. Were the single stage voltage gain increased to 6 dB, the noise figure penalty would be reduced to 1 dB.

Table I, shown below, compares a cascaded constructive traveling wave amplifier according to implementations of the current subject matter with currently available amplifier techniques. The current subject matter is distinct from distributed amplifiers because the cascaded traveling wave provides a passband response at a center frequency determined by the feedforward transmission line length and feedback delay. The current subject matter can provide cascaded gain and is not restricted to distributed amplifier gain limits. However, the gain per stage is generally low due to the trade-off between acceptable return loss and single stage gain. Both the gain and the bandwidth of the response are controlled through the voltage feedback gain. Consequently, implementations of the current subject matter can trade maximum gain for a wideband response. The matching behavior of the stages in the current subject matter can maintain impedance matching outside of the bandwidth of the gain response. The stability of a stage according to the current subject matter can improve with transmission line losses and can be relatively insensitive to voltage feedback gain variations. A moderate noise figure penalty can be provided due to the low maximum achievable gain per stage. However, the current approach is capable of operating with only a one-quarter wave transmission line per stage and a small overall area consumption. With respect to cascaded narrowband techniques, the current approach may consume more power for a given overall gain but provides advantageous broadband impedance matching characteristics.

TABLE I

COMPARISON OF CONVENTIONAL AMPLIFIER CIRCUIT TECHNIQUES

|  | Cascaded Narrowband | Cascaded Wideband | Distributed Traveling Wave | Cascaded Traveling Wave |
| --- | --- | --- | --- | --- |
| Bandwidth | Narrow | Moderate | Broad | Moderate |
| Gain | High | Low | Low | Moderate |
| Matching Bandwidth | Narrow | Moderate | Broad | Broad |
| Noise Figure | Low | Moderate | Moderate | Moderate |
| Area | Moderate | Low | High | Low |
| Power Consumption | Low | Moderate | High | High |

Features of a cascaded traveling wave topology according to some implementations described herein can include amplification of the forward traveling wave and opacity, or isolation, of the backward traveling wave. In an implementation, a shunt-shunt active feedback system can be provided with a HBT device in a 0.12 μm SiGe BiCMOS technology. The active feedback at each stage 700 is based on a cascade of the common emitter device 704, and the emitter follower devices 706. The feedback path 702 advantageously provides high input and output impedance to prevent loading of the transmission line 712 and further introduces a delay $T_d$ that promotes constructive interference with the forward propagating wave 714 and destructive interference with the backward traveling wave 716. The emitter follower 706 increases the collector-emitter voltage of the common emitter device 204 to enhance the transconductance of the feedback stage 702 and reduces capacitive loading of the shunt-shunt feedback on the input port 720 and output port 722 of the transmission line 712. Additionally, the base-collector capacitance of the common emitter device 204 terminates into a high-impedance node between the emitter follower 706 and degenerated common emitter 710. The emitter follower 706 advantageously has, in some implementations, a large input impedance to minimize loading of the capacitance of the base-emitter at the stage output 722. A HBT implementation can offer high impedance and transconductance with a target frequency, $f_T$, of 200 GHz and a maximum frequency, $f_{max}$, of 280 GHz. Consequently, a feedback amplifier using a series of stages 700 can satisfy the desired delay requirements through the feedback path 702 at 100 GHz.

Figures 7A, 7B:
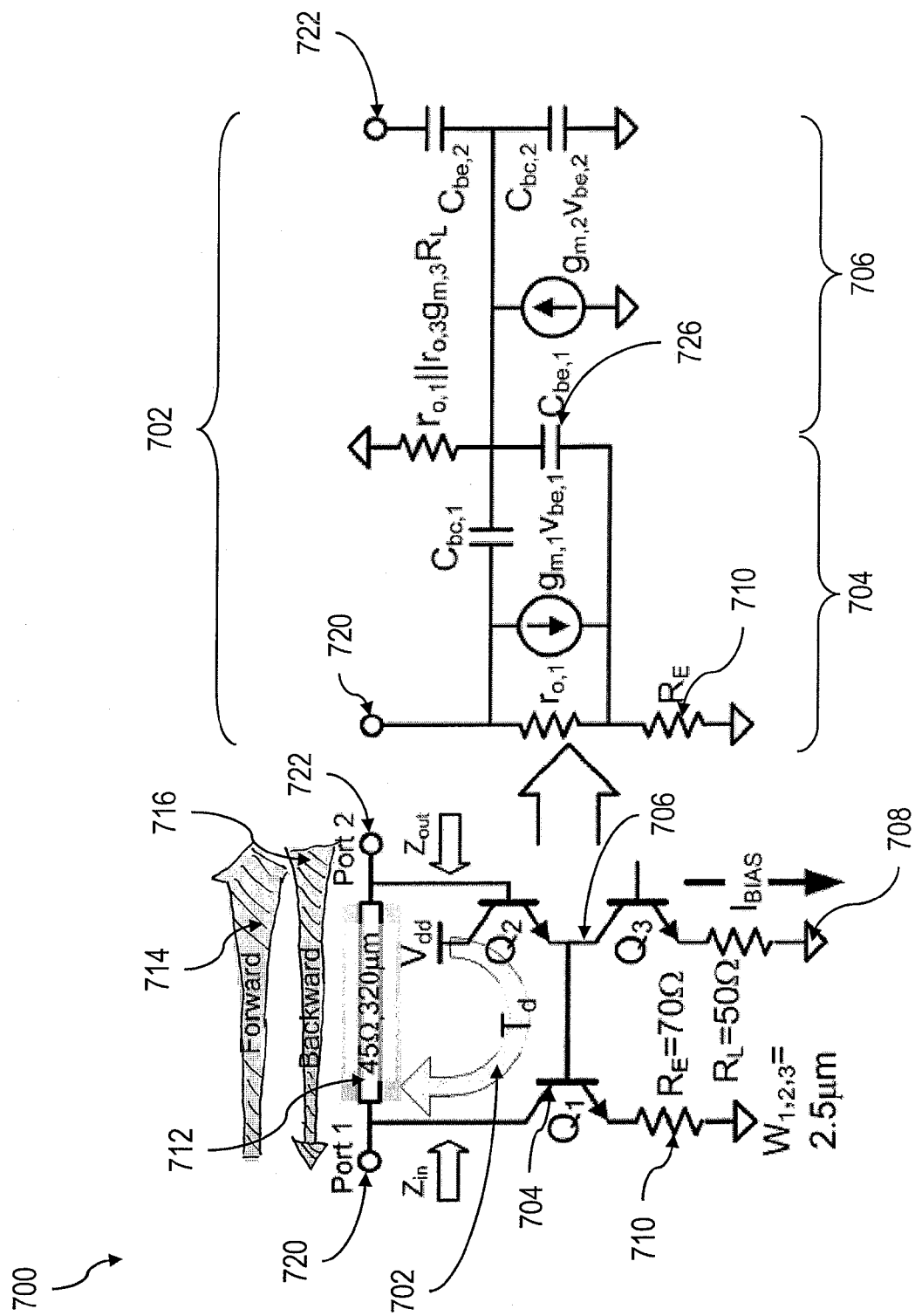
FIG. 7A is a circuit diagram showing a single stage for an implementation using shunt feedback in a SiGe HBT.
FIG. 7B is a circuit diagram showing a detail of the feedback path in the single stage of FIG. 7A.
Figure 8:
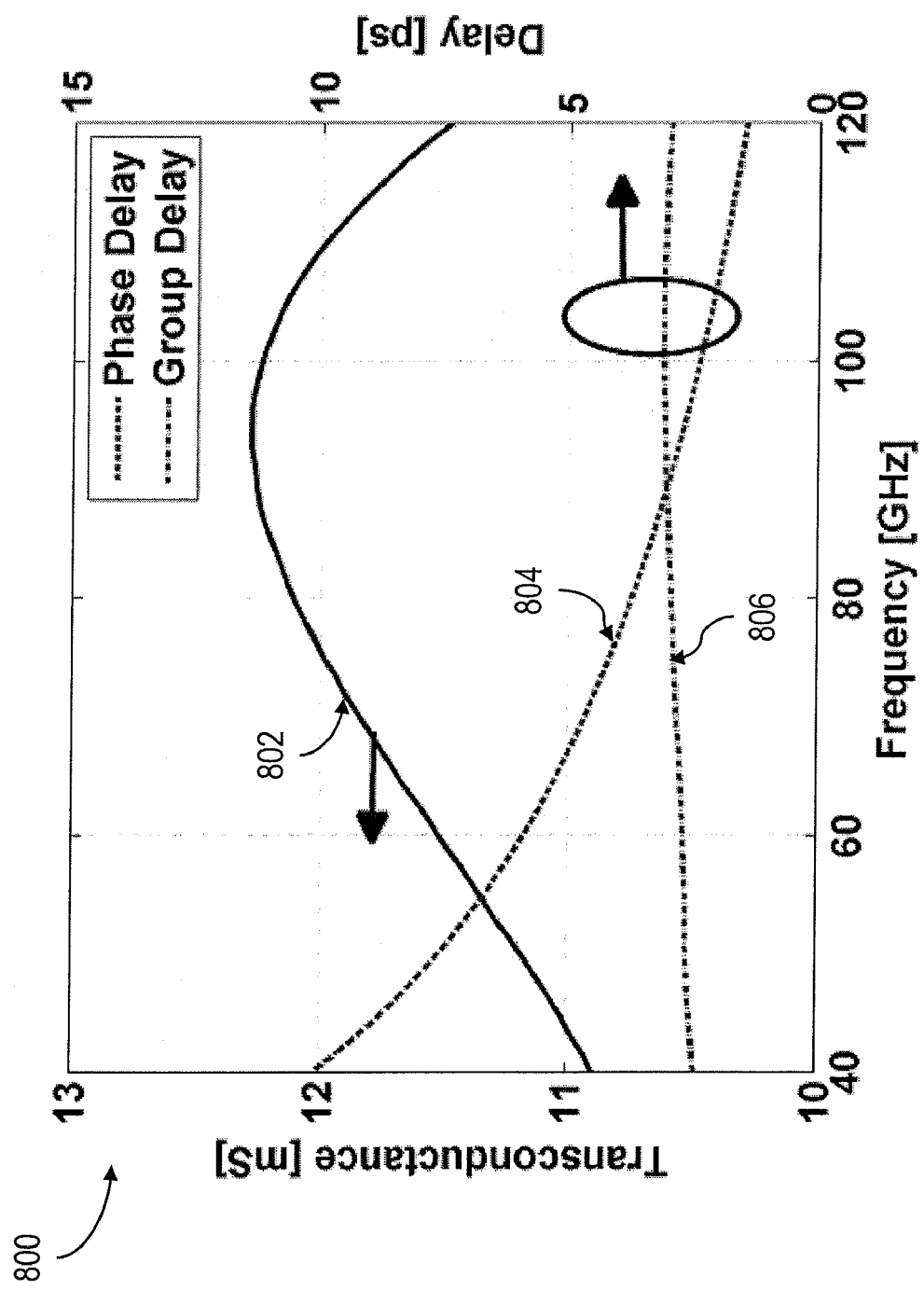
FIG. 8 is a chart showing feedback transconductance and delay for a 0.12 μm SiGe heterojunction bipolar transistor circuit implementation.

FIG. 7B shows additional detail of an implementation of an active feedback path, such as stage 702. The mid-band transconductance, $g_m$, of the feedback path 702 can be obtained from:

$$g_m = \frac{g_{m,1}}{1+g_{m,1}R_E} \frac{g_{m,2}g_{m,3}r_{o,3}R_L}{1+g_{m,2}g_{m,3}r_{o,3}R_L} \approx \frac{g_{m,1}}{1+g_{m,1}R_E}. \quad (21)$$

where $R_E$ represents the resistance value of resistor 710 and $r_0$ represents the resistance value of resistor 724. The feedback gain can be obtained by degeneration through $R_E$ 710. In the design shown in FIG. 7A and FIG. 7B, the common emitter device 204 is biased for a transconductance, $g_m$, of 60 mS while $R_E$ is 70Ω. Therefore, the feedback gain is ideally $A_v=0:27$ for a single stage gain of 1.37. Results of a simulation of the transconductance and phase and group delays through the active feedback path or stage 702 of FIG. 7B are shown in the chart 800 of FIG. 8. As shown in FIG. 8, the magnitude of the transconductance 802 rolls off gradually with frequency and achieves a degenerated transconductance of 10.5 mS at 100 GHz. The phase delay 804 of the feedback stage also decreases with increasing frequency because of the impact of capacitance between the emitter follower and common emitter stages and is 2.3 ps at 100 GHz. The feedback group delay 806 is also plotted and remains around 2.7 ps across the frequency range.

Maintaining high impedance at the input (port 1) 720 and output (port 2) 722 of the active feedback stage 700 is critical to reducing loading on the transmission line 712. The input impedance at the base of the common emitter stage 704 may be determined as follows:

$$Z_{in,1} = r_{b1} + \frac{\left(1+sC_{bc,1}\frac{Z_o}{2}\right)(1+sC'_{be,1}R_E)}{s\left(C'_{be,1}+C_{bc,1}\left(1+g'_{m,1}\frac{Z_o}{2}\right)\right)+s^2C_{bc,1}C'_{be,1}\left(R_E+\frac{Z_o}{2}\right)} \quad (22)$$

where $C_{be;1}=C_{be;1}/[1+g_mR_E]$ and $Z_0/2$ is estimated as the impedance at the collector 720 of the common-emitter 704 transistor. Similarly, the impedance at base of the emitter follower stage 706 may be determined as follows:

$$Z_{in,2} = r_{b2} + \frac{1}{sC_{be,2}} + Z_{in,1}\left(1+\frac{g_{m,2}}{sC_{be,2}}\right) \quad (23)$$

Substituting equation (22) into equation (23), the total feedback input impedance at the output port (port 2) 722 of the amplifier stage 700 may be determined as follows:

$$Z_{in,2} \approx r_{b1}+r_{b2}+R_E+\frac{R_E g_{m,1}g_{m,2}}{s^2C_{be,1}C_{be,2}}+\frac{1}{sC_{bc,2}}+\frac{g_{m,1}R_E}{sC_{be,1}}+\frac{g_{m,2}R_E}{sC_{be,2}} \quad (24)$$

The impedance includes resistive and capacitive components. The capacitance at the emitter 726 of the emitter follower stage 706 contributes to negative resistance at the input impedance port 720. However, the input resistance remains positive because of the relatively high base resistance for the SiGe HBT and contribution of the resistive degeneration 710. The base-collector capacitance of the emitter follower transistor 706 directly loads the input of the feedback stage 702.

The output impedance of the feedback stage 702 can then be determined as follows:

$$Z_{out} = (1+g_{m,1}r_{o,1})R_E + \frac{1}{sC_{bc,1}} \quad (25)$$

The output impedance has a relatively large output resistance because of the emitter degeneration 710 and the capacitance seen at this node is limited to the base-collector capacitance of the common emitter 704 transistor.

Figure 9:
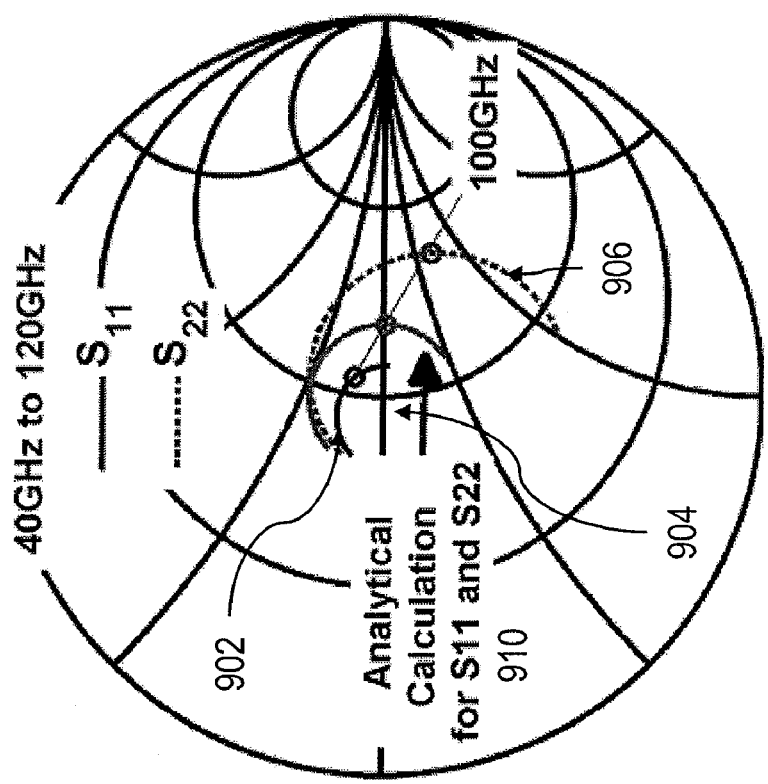
FIG. 9 is a Smith chart showing analytical calculations and circuit simulations of input and output matching for a single stage of an amplifier according to an implementation.

The matching of the feedback stage 702 when shunted by the feedforward transmission line is simulated in the Smith chart 900 of FIG. 9. The input port impedance (S11) 902 rotates clockwise around the center 904 of the Smith chart as expected from the analysis of the input and output impedance in equation (9a) and equation (9b). From 40 to 140 GHz, the magnitude of the input port impedance line 902 remains relatively constant due to the high impedance in equation (25). The output port impedance (S22) 906 also rotates around the center 902 of the Smith chart but illustrates a larger impedance mismatch because of the frequency dependent resistive and admittance components in equation (24). The measured matching 910 for both the input and output ports is compared to the analytical prediction in FIG. 9 at 100 GHz and provides reasonable prediction of the matching behavior.

The gain sensitivity of a traveling wave stage can be subject to variation of the active devices in the feedback circuit and can be determined from equation (7) as follows:

$$\frac{\partial G_{ss}}{\partial A_U} = \frac{1}{(1-A_U)^2} = G_{ss}^2 \qquad (26)$$

While this expression illustrates the susceptibility to feedback gain variations, the sensitivity of the feedback circuit to process, voltage and temperature (PVT) variations is mitigated by several factors. First, the high degeneration of the common emitter amplifier can reduce the PVT variations of the common emitter transistor. Second, the high-frequency, high-current transconductance-limiting mechanisms of the SiGe HBT also improve the robustness of the circuit. The sensitivity of the feedback circuit to PVT can be primarily due to changes in the transit time of the device and, consequently, the time delay through the feedback path as well as the transconductance of the feedback path.

The simulated sensitivity to process and voltage variations of the forward transmission coefficient S21 and the reverse transmission coefficient S12 are illustrated in the charts 1000 and 1050 of FIG. 10A and FIG. 10B, respectively. In this analysis, the process corners of the HBT model are varied between ±1σ, where σ is the standard deviation of the device operation. The single stage gain reduces in amplitude and center frequency for the slow corner and increases in amplitude for the fast corner. Shifts in the center frequency and gain occur because the transconductance and the transit time of the device change inversely with respect to one another. The lower center frequency for the slow corner is expected because the device contributes to more total phase through the feedback loop. Overall the gain changes by 8% and the center frequency by 10% over these process corners.

Secondly, a supply voltage variation of ±5% (between $V_\alpha$=1.9 and $V_\alpha$=2.1) is also illustrated in FIG. 10A and FIG. 10B and, as shown, has a negligible impact on S21 and S12. Since the device is biased for maximum target frequency, $f_T$, a perturbation in the supply voltage reduces the transconductance slightly from its maximum and does not change the voltage gain significantly. The single stage gain has under 1% difference from the nominal condition. Additionally, the higher supply operation at 2.1V illustrates a reduced center frequency with respect to the lower supply because the high-current effects of the HBT induce additional phase through the feedback. The overall shift in the center frequency is around 2%.

The local stability of the stage can be inferred from FIG. 10A and FIG. 10B considering the basic guideline that the magnitude of S21 and S12 be less than unity. Across both the process and the voltage corners, this condition can be maintained and the local as well as global stability can be ensured. Finally, the cascading constructive traveling wave amplifier effectively combines the traveling wave over multiple amplifier stages and, in the presence of PVT variations, stage-to-stage variations will tend to be averaged over multiplied amplifier stages.

Figure 11:
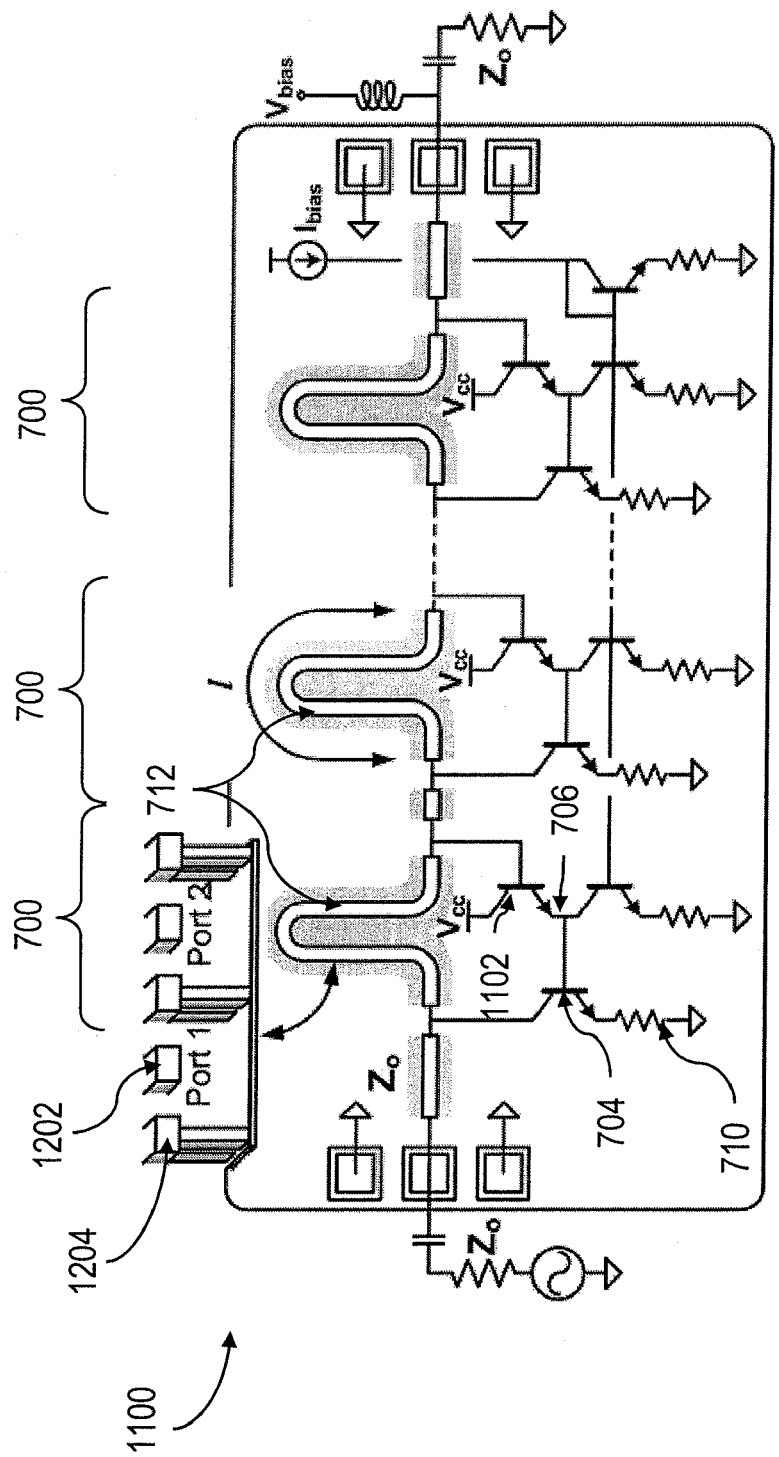
FIG. 11 is a diagram showing aspects of a cascaded constructive wave amplifier according to an implementation.

FIG. 11 shows an overall circuit implementation for a twelve-stage amplifier 1100 with uniform sizing for each stage 700, the biasing of the collector for the common emitter 704 of each stage 700 is provided through the RF input path while the biasing of the collector for the emitter follower 706 is provided through d.c. pads (not shown). A current bias for the emitter follower 706 can be provided through an on-chip mirror.

Figure 12:
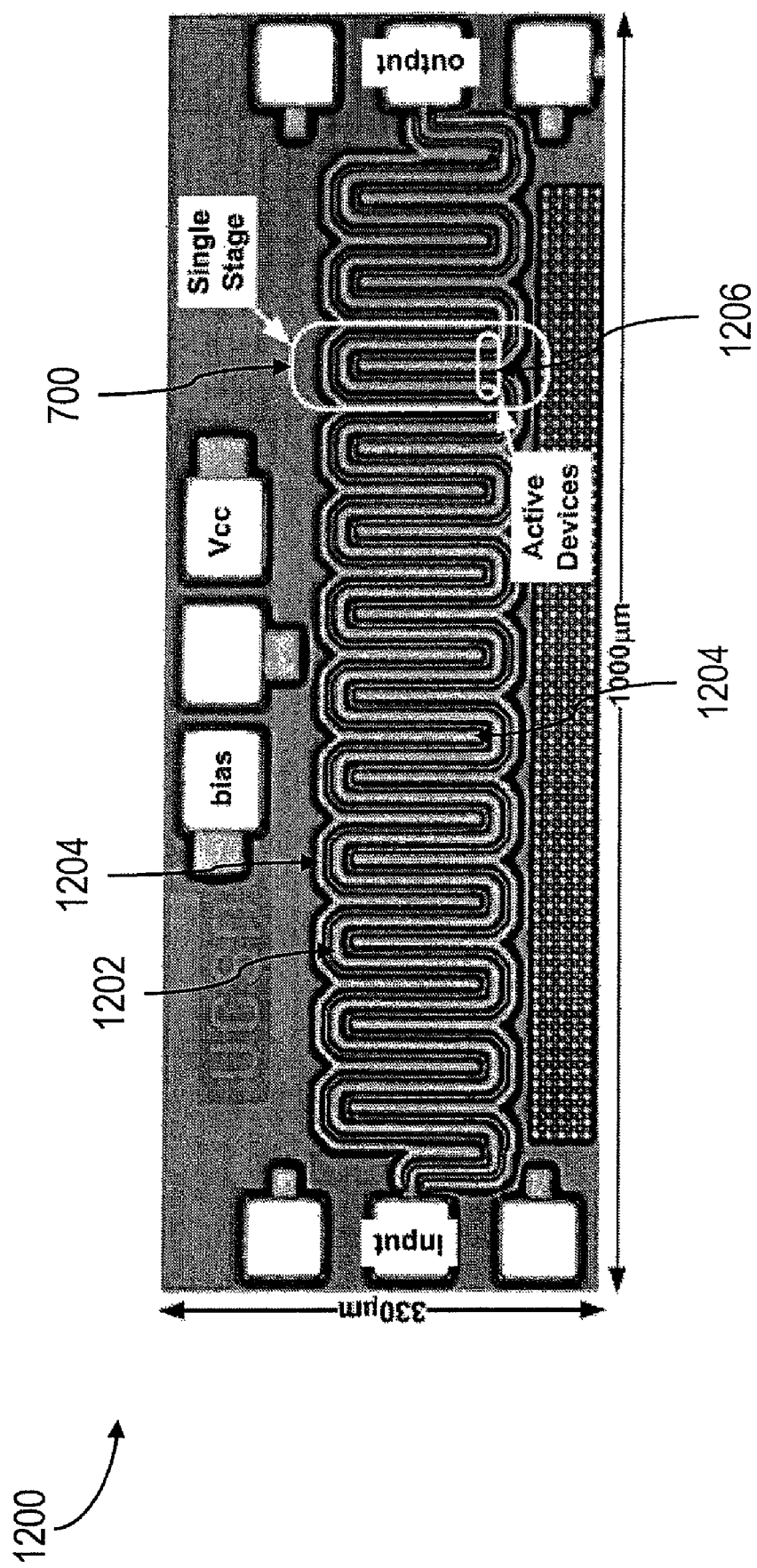
FIG. 12 is a micrograph of a chip containing a 12-stage cascaded constructive wave amplifier.

A chip microphotograph of an amplifier chip 1200 according to an implementation is shown in FIG. 12 and measures 330 µm by 1000 µm including pads. The area of a single stage 700 measures 160 µm by 60 µm. The transmission line 1202 is a shielded microstrip with characteristic impedance of 45Ω. The inset in the upper left of FIG. 11 illustrates the cross-section of the meandering transmission line 1202 and its side shields 1204. The transmission lines 1202 are shielded microstrip lines 1204 where the side shields 1204 are shared between neighboring cells 700. Electromagnetic simulation using HFSS verify that potential coupling between stages 700 through this side shield 1204 was under −20 dB. In particular, the input return loss improves by 5 dB from the single wire model with the shared side shield 1204. Within a single stage 700, the shielded coplanar transmission line 1202 meanders through a length of 220 µm. The transmission line 1202 length is shorter than the theoretical quarter wave transmission line because of the capacitive loading of the active feedback on the transmission line structures. Consequently, this meandering structure is area efficient and minimizes the distance between the input and output of the stage 700. Additionally, interstage transmission lines are located between stages and are 40 µm long. These interstage transmission lines are provided to maintain isolation of the active devices 1206 between stages.

Figure 13:
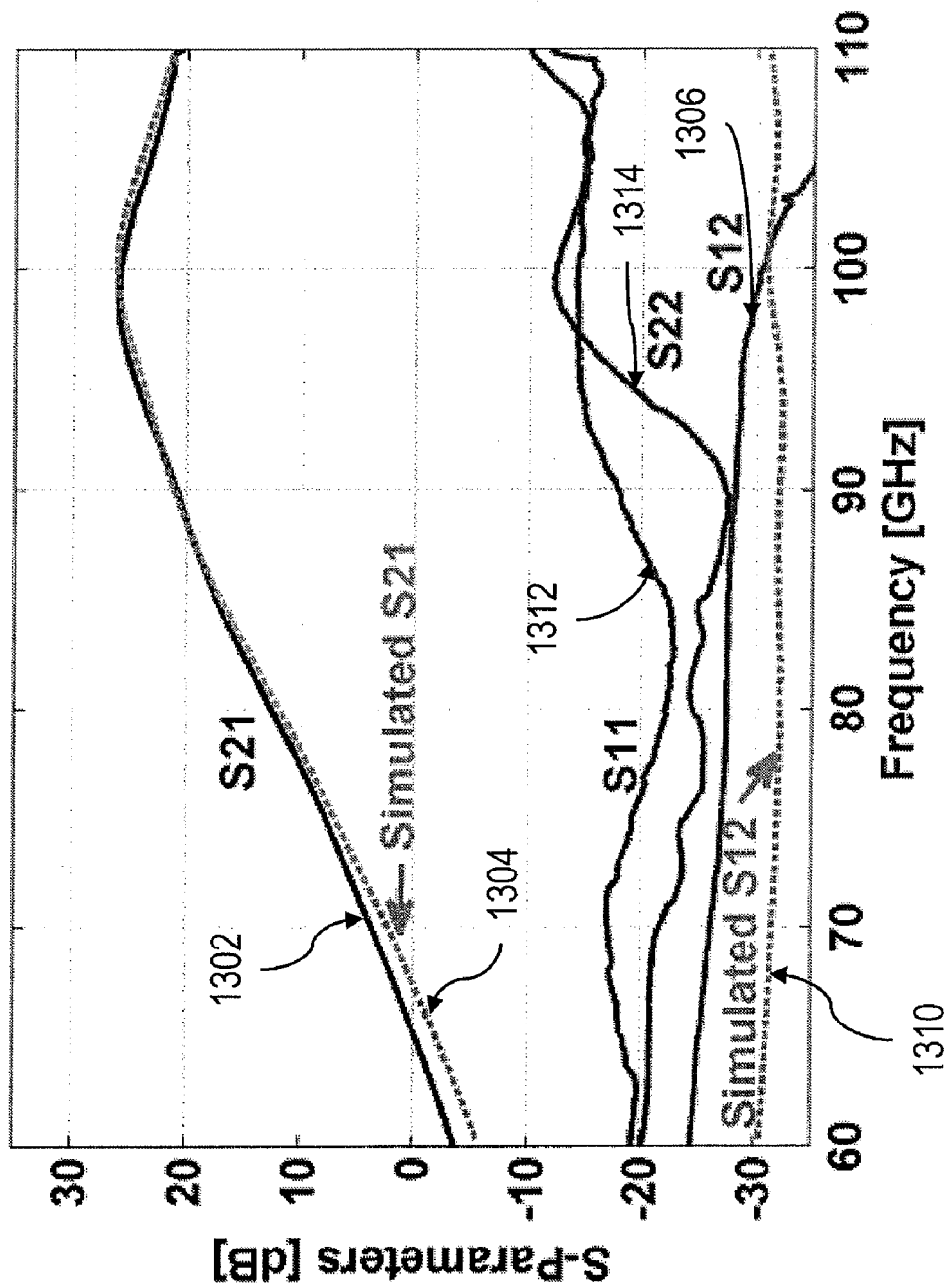
FIG. 13 is a chart showing S-parameter measurements of a 12-stage cascaded constructive wave amplifier according to an implementation.

S-parameters for the 12-stage amplifier 1200 shown in FIG. 12 were characterized with an Agilent E8361A two-port network analyzer and N5260A mm-wave controller using Cascade ACP110-LW GSG probes. The measured S-parameters are shown in the chart 1300 of FIG. 13 for the twelve stage amplifier 1200. The forward and backward transmission illustrates amplification of the forward wave and isolation of the backward wave. The S21 measurement 1302 reaches a gain of 26 dB at 99 GHz over a 3 dB bandwidth of 12 GHz between 93 and 106 GHz. Since the traveling wave is amplified through twelve cascading stages, the average gain of each stage is 2.2 dB as compared to 2.3 dB from the analysis and design. The S21 measurement 1302 is compared to circuit simulations 1304 performed over twelve stages and demonstrates accurate prediction of the nominal gain and bandwidth. Alternately, the S12 measurement 1306 is −30 dB at 99 GHz and remains relatively constant at low frequencies and rolls-off above 99 GHz. The simulation 1310 for S12 also agrees reasonably well with the measurement 1306. The measured input return loss 1312 (S11) across the 3 dB bandwidth is better than −15 dB while the measured output return loss 1314 (S22) is better than −12 dB. Both the input and output return loss remain under −10 dB over the measured 40-110 GHz range.

Figure 14:
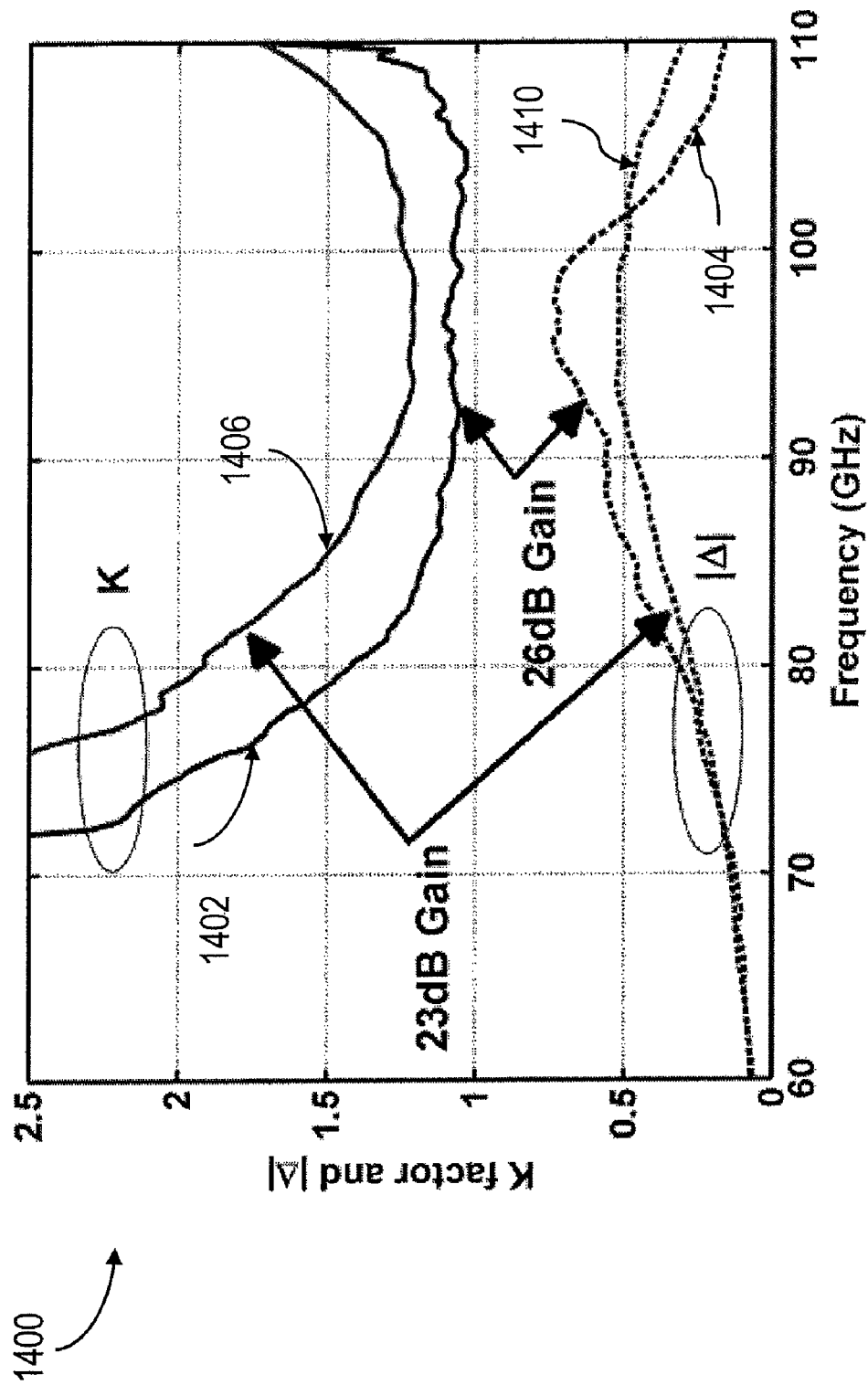
FIG. 14 is a chart showing measured stability of a 12-stage cascaded constructive wave amplifier according to an implementation.

The stability at the nominal 26 dB operating point is illustrated in the chart 1400 of FIG. 14. At the recorded gain of 26 dB, the measured K 1402 is greater than one and the measured |Δ| 1404 is less than one at all frequencies indicating unconditional stability for the amplifier 1200. The stability margins are improved by reducing the gain of each stage and, therefore, the overall gain. Reducing the bias current, $I_{bias}$, reduces the emitter follower gain and, hence, $A_v$. A gain of 23 dB, or roughly 1.92 dB per stage, is also graphed in FIG. 14 to illustrate the improved stability margins through increased K 1406 and reduced |Δ| 1410 with respect to the result at 26 dB. Higher gain is possible from the amplifier 1200 but the operation is conditionally stable.

Figure 15A:
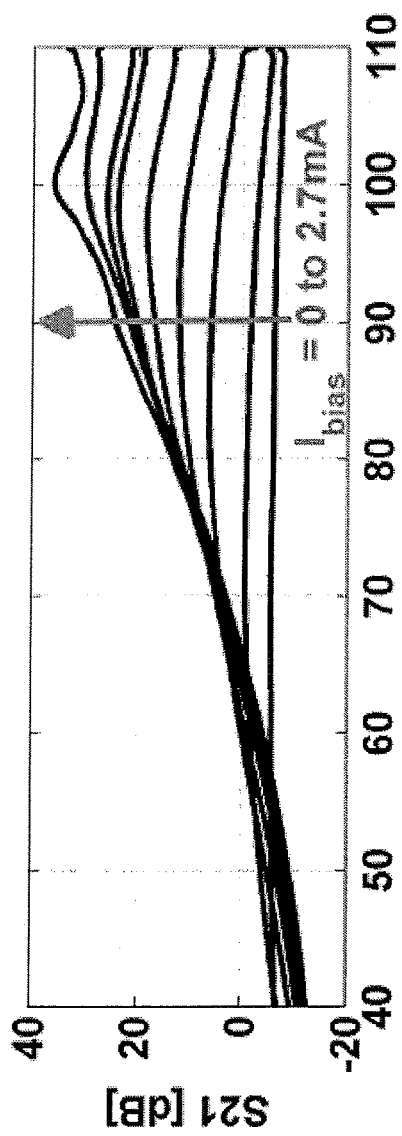
FIG. 15A is a chart showing an example of forward transmission for an increasing emitter follower bias current according to an implementation.
Figure 15B:
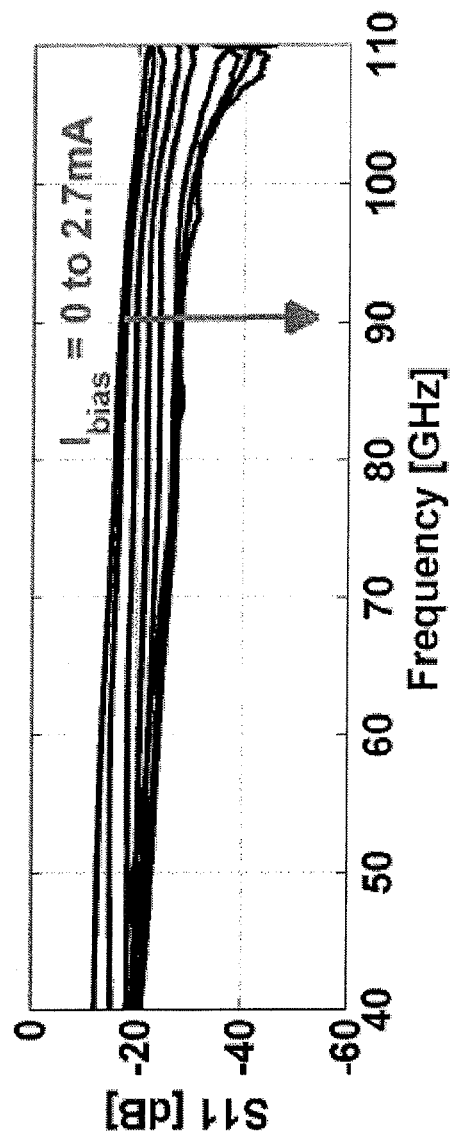
FIG. 15B is a chart showing an example of backward transmission for an increasing emitter follower bias current according to an implementation.
Figure 16A:
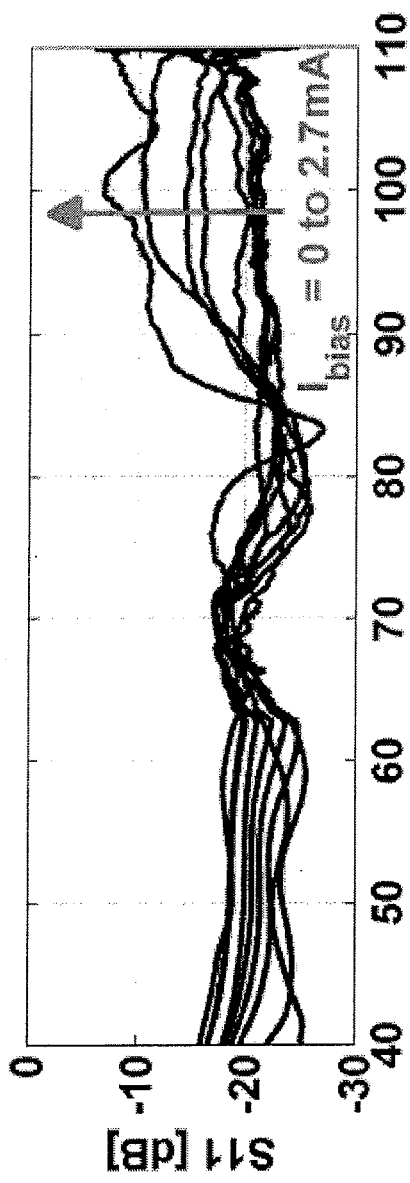
FIG. 16A is a chart showing the S11 return losses for an increasing emitter follower bias current according to an implementation.
Figure 16B:
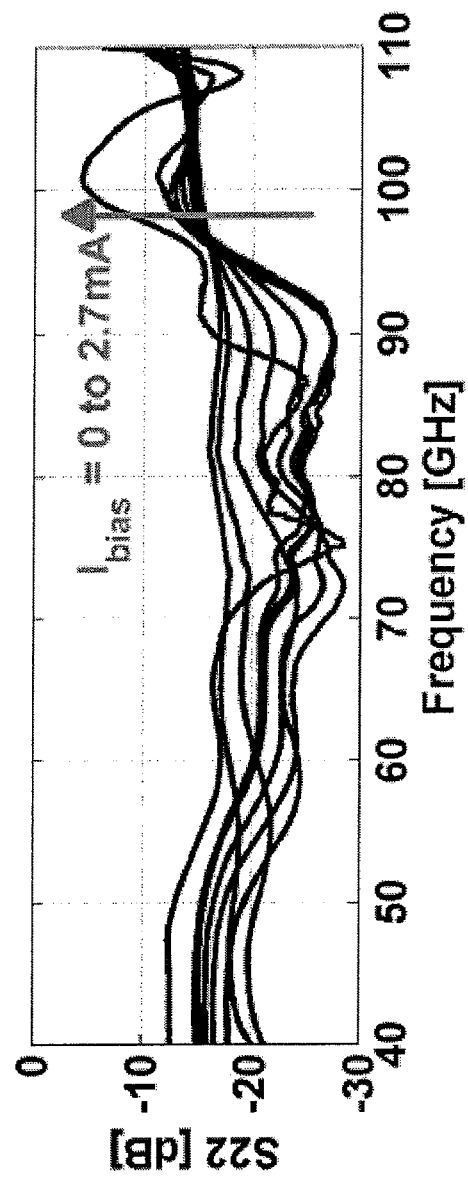
FIG. 16B is a chart showing the S22 return losses for an increasing emitter follower bias current according to an implementation.

Control of the gain through the emitter follower bias is predicted from the analysis to trade-off with bandwidth. The forward transmission is plotted in the chart 1500 of FIG. 15A and the reverse transmission is plotted in the chart 1550 of FIG. 15B for bias current, $I_{bias}$, ranging from 0 mA to 2.72 mA. As shown, at the low bias condition, the S21 and S12 are reciprocal and are around −6 dB, a loss of 0.5 dB per stage, from 60 to 110 GHz. As the bias current increases, the forward transmission gain increases to a maximum gain is 35.5 dB while the backward transmission gain decreases to −30 dB. Under the highest gain condition, the amplifier is conditionally stable but does not oscillate under 50Ω matching at the input and output. The input return loss is plotted in the chart 1600 of FIG. 16A and the output return loss is plotted in the chart 1650 of FIG. 16B as a function of the bias current. As shown, the matching is relatively insensitive to the bias and remains under 10 dB over most operating conditions. At 35 dB gain, the output return loss decreases to 8 dB above 99 GHz. At lower frequencies, the return loss does not change dramatically with the bias current.

Figure 17:
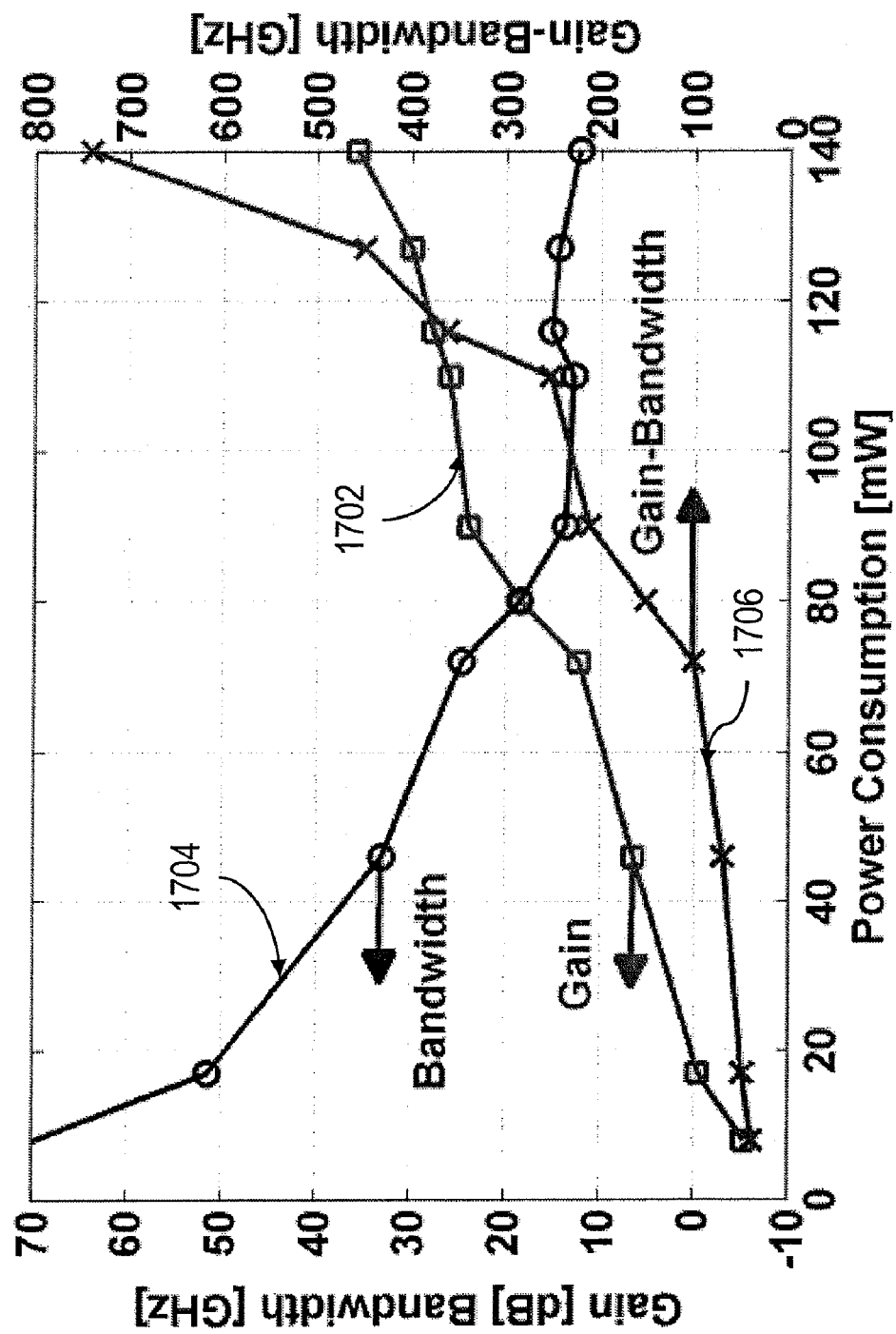
FIG. 17 is a chart showing gain and bandwidth tradeoffs for a 12-stage cascaded constructive wave amplifier according to an implementation.

The gain 1702, bandwidth 1704, and gain-bandwidth product 1706 of the example 12-stage amplifier are plotted in the chart 1700 of FIG. 17 as a function of total power consumption. The gain 1702 is controlled through the bias current, $I_{bias}$, and causes proportionally higher power consumption. As the forward transmission gain 1702 increases from 0 dB to 35 dB, the bandwidth 1704 of the amplifier 1200 decreases from 50 GHz to 12 GHz. The bandwidth 1704 does not change significantly for bias currents above 1.8 mA. While the bandwidth is 12 GHz at 26 dB gain, the bandwidth 1704 at a 35 dB gain is 12.1 GHz. Finally, the achievable gain-bandwidth product 1706 of the twelve stage amplifier 1200 is 260 GHz at 26 dB and increases to 740 GHz at 35 dB. These values illustrate new records for the performance of Si/SiGe technologies.

Figure 18:
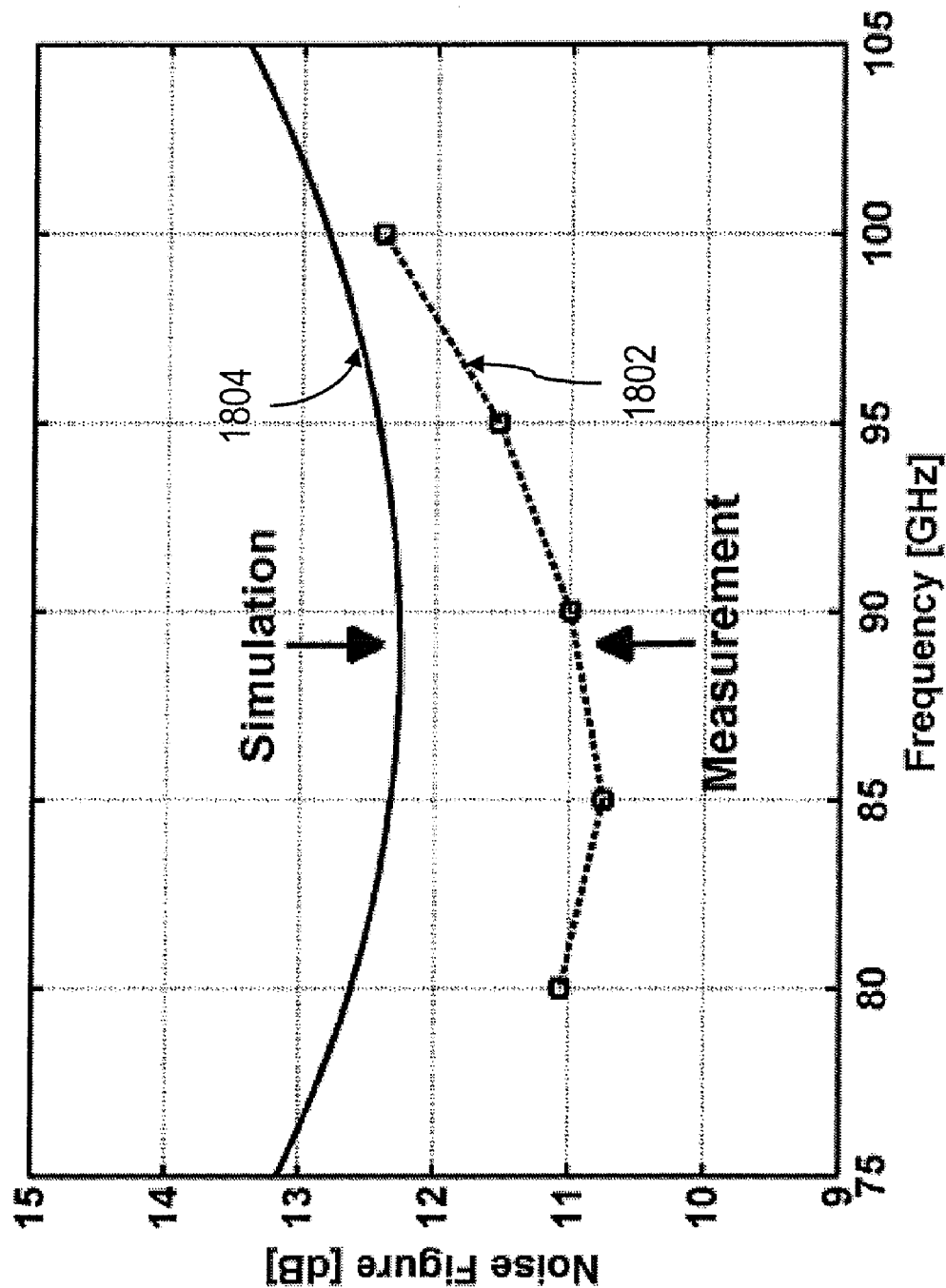
FIG. 18 is a chart showing measured and simulated noise figures for a 12-stage cascaded constructive wave amplifier according to an implementation.

The measured 1802 and simulated 1804 noise figures for the amplifier 1200 is plotted in the chart 1800 of FIG. 18. The noise figure was measured using a W-band noise source which specifies an excess noise ratio in increments of 5 GHz from 75 GHz to 110 GHz. The output noise spectrum of the amplifier 1200 was downconverted using a Millimeter Wave W-band mixer to an IF frequency between 4 GHz and 10 GHz. The LO generated from an RF synthesizer was tripled to 90 GHz using a Millimeter W-band frequency tripler and filtered with a 90 to 100 GHz bandpass filter. A two-stage IF amplifier provided 24 dB of gain to compensate the conversion loss of the mixer. The noise figure of the down-conversion stage was initially calibrated with a spectrum analyzer. Additionally, cable and probe losses of 7.5 dB were also de-embedded from the noise figure measurement. The noise figure test setup was compared to a QuinStar QLW series 92-98 GHz amplifier and found to have less than 0.2 dB error from the manufacturer specification. Simulation 1804 of the twelve stage amplifier predicts a minimum noise figure of 12.2 dB but the measured noise figure 1802 is even lower—as low as 10.8 dB at 85 GHz. At 99 GHz, the measured noise figure 1802 is 12.3 dB.

Figure 19:
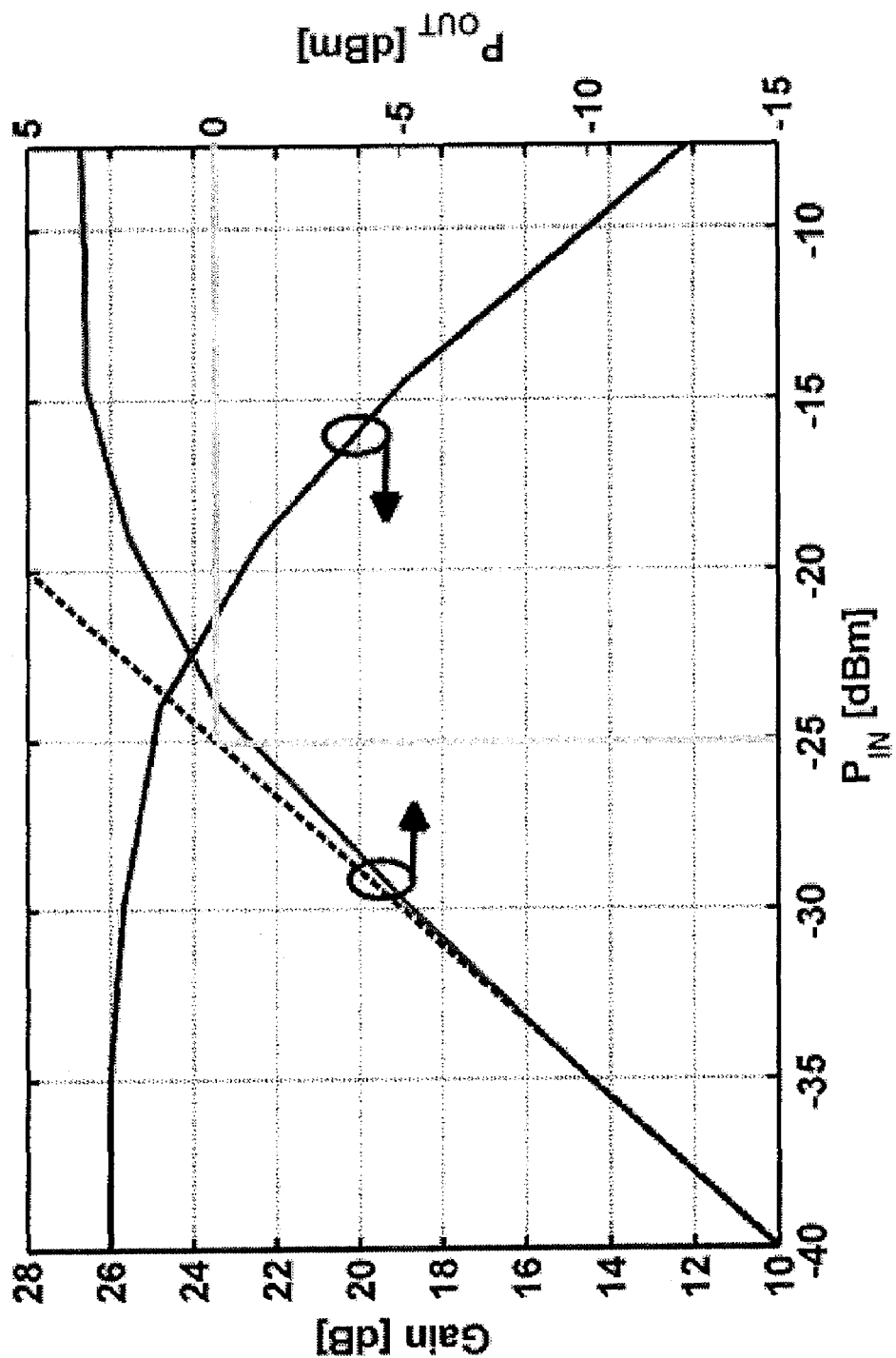
FIG. 19 is a chart showing measured gain compression for a 12-stage cascaded constructive wave amplifier according to an implementation.

The gain compression is plotted in the chart 1900 of FIG. 19 under the nominal biasing conditions using a power meter with a power sensor. The input power is swept by controlling the attenuation of the network analyzer millimeter wave head. The output-referred 1 dB compression point for the amplifier was recorded at −0.1 dBm and the input-referred compression point is approximately −25 dBm. At the nominal unconditionally stable gain of 26 dB, the amplifier 1200 was measured at a nominal current consumption of 32.5 mA for the emitter follower stages from a 2.2V supply and 21 mA for the common emitter stages each from a 2V supply. The emitter follower bias current is provided through an external current bias. The total power consumption was 114 mW, which guarantees unconditional stability at 26 dB and provides a maximum achievable gain of 35 dB.

Figure 20:
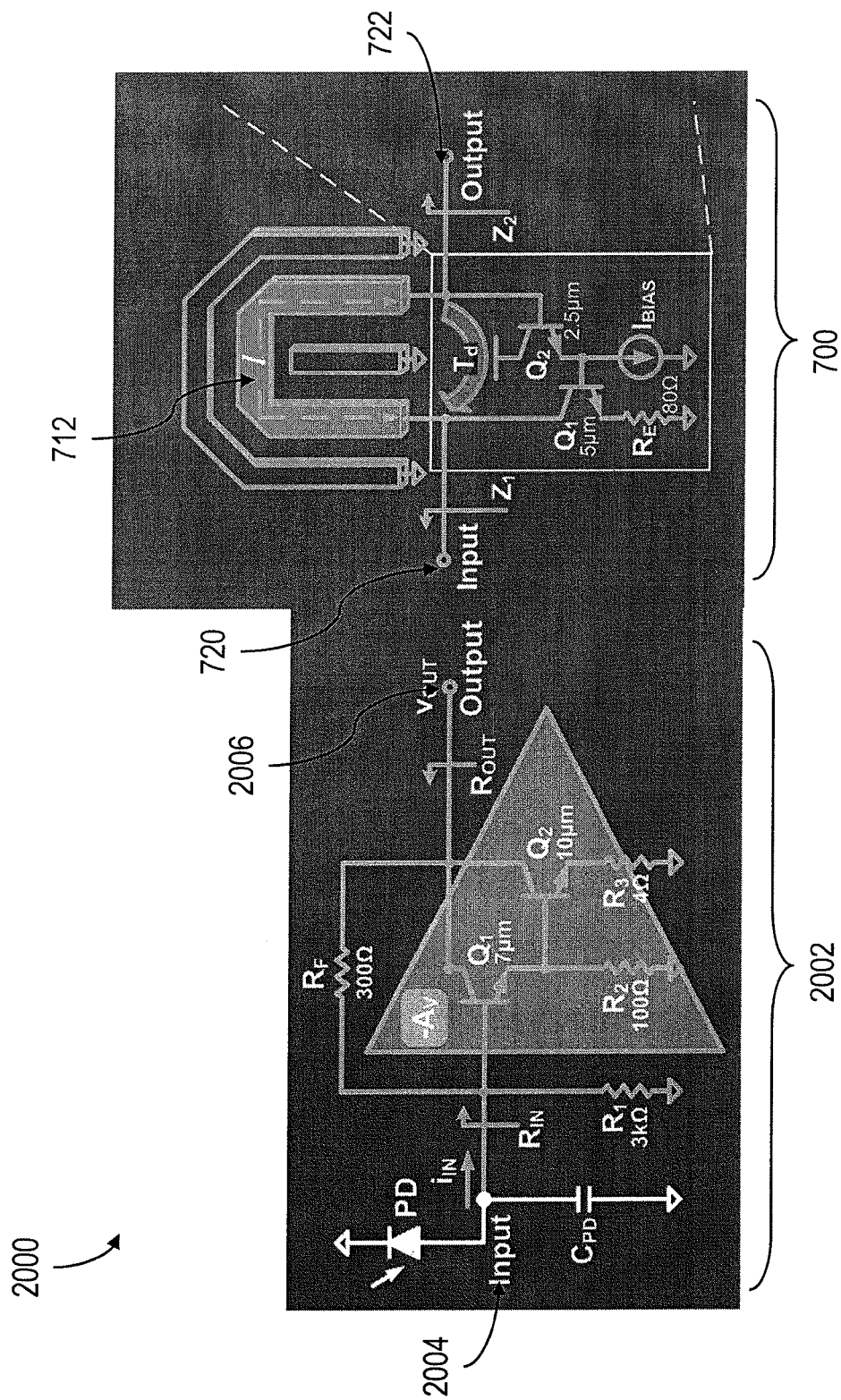
FIG. 20 is a circuit diagram showing a system having a Darlington amplifier circuit coupled to a cascaded constructive wave amplifier stage.
Figure 21A:
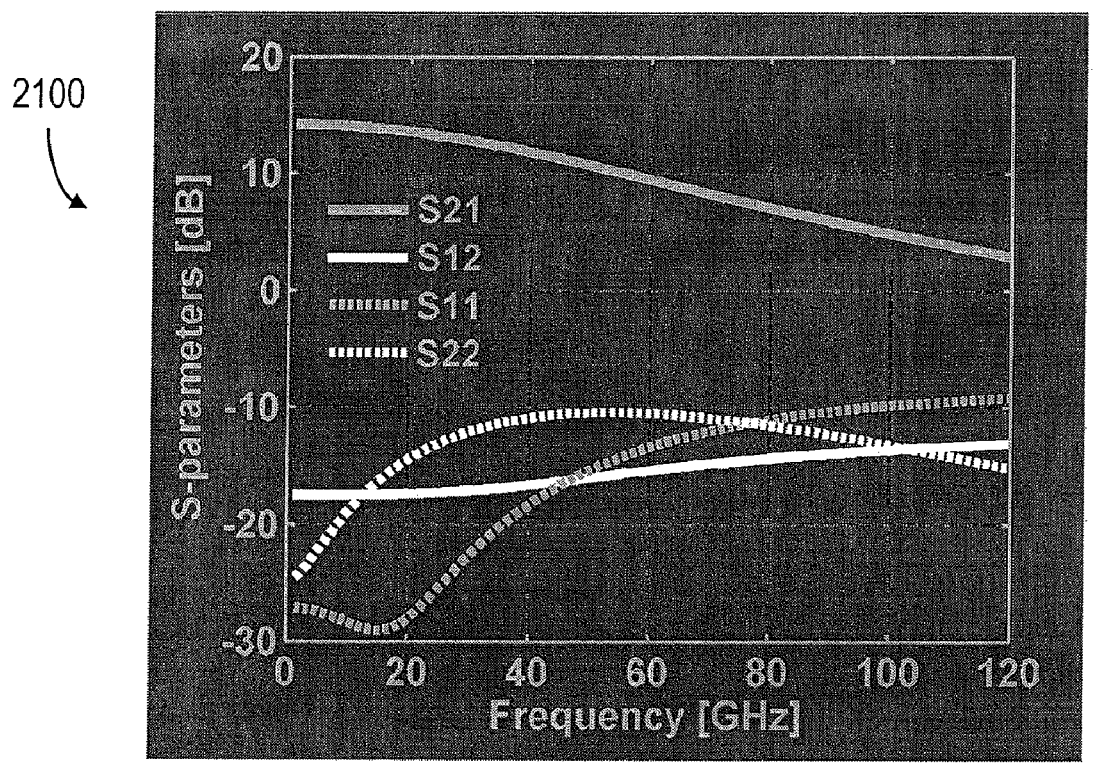
FIG. 21A is a chart showing gain responses for the Darlington amplifier of the system in FIG. 20.
Figure 21B:
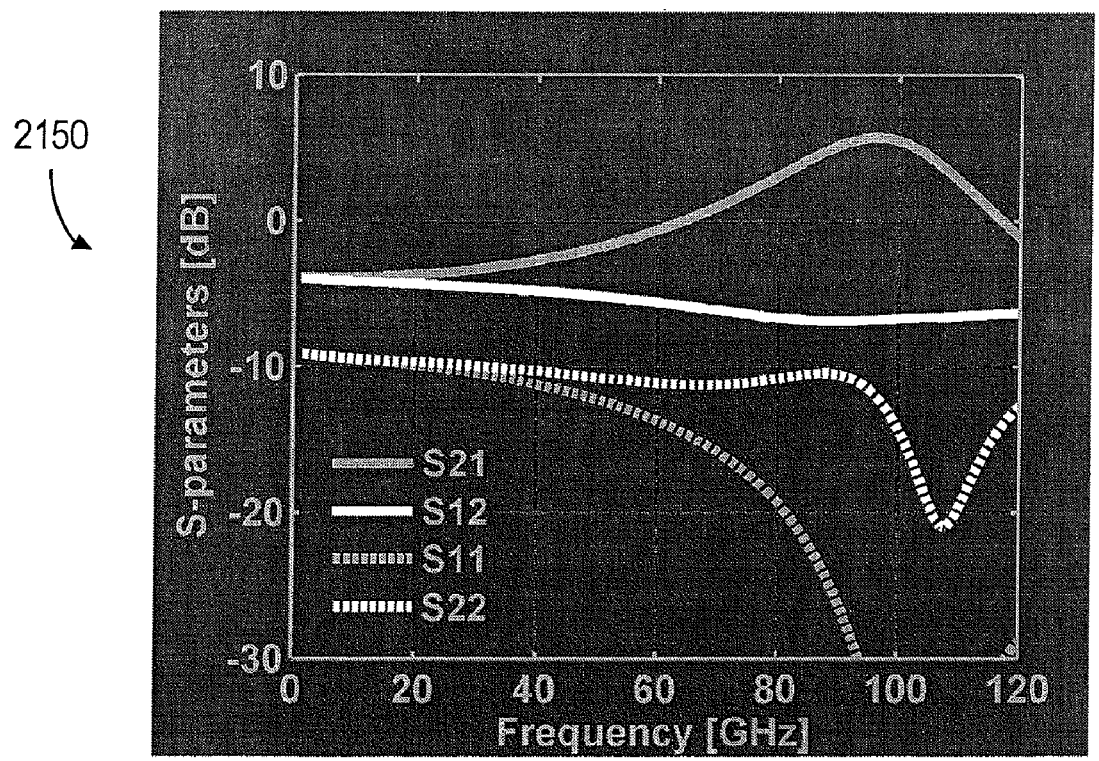
FIG. 21B is a chart showing gain responses for the cascaded constructive wave amplifier stage of the system in FIG. 20.

In a further implementation illustrated in FIG. 20, a system 2000 can include a cascaded constructive wave amplifier stage 700 as described herein coupled to a Darlington amplifier 2002. A signal input at the input port 2004 of the Darlington amplifier 2002 is amplified according to the response of the Darlington amplifier 2002 and output via the output port 2006. The Darlington amplifier 2002 provides good gain on the S21 band at lower frequencies as shown in the chart 2100 of FIG. 21A but has very little impact at higher frequencies. A cascading constructive wave amplifier according to the current subject matter has complementary performance as shown in the chart 2150 of FIG. 21B.

Figure 22A:
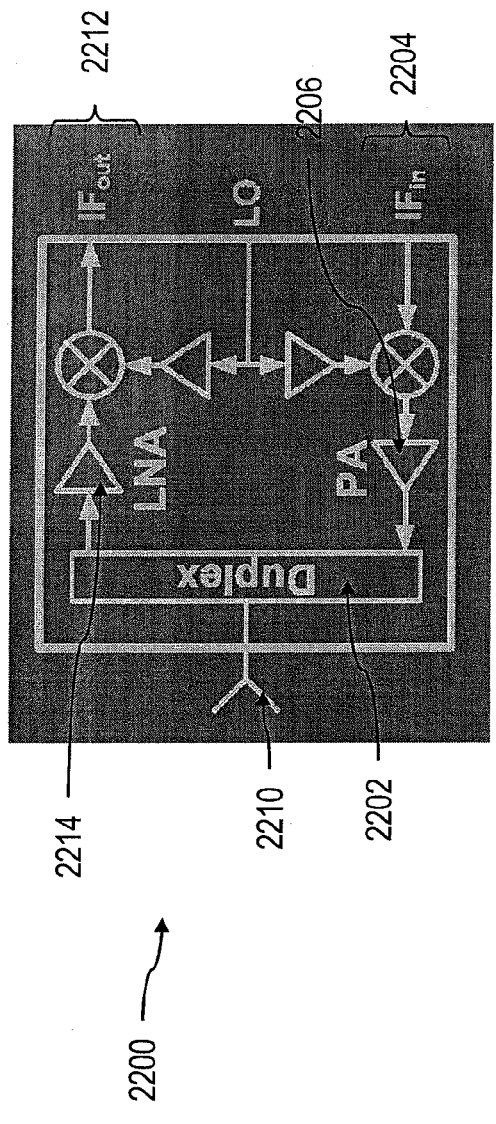
FIG. 22A is a circuit diagram showing a half-duplex radio transceiver.
Figure 22B:
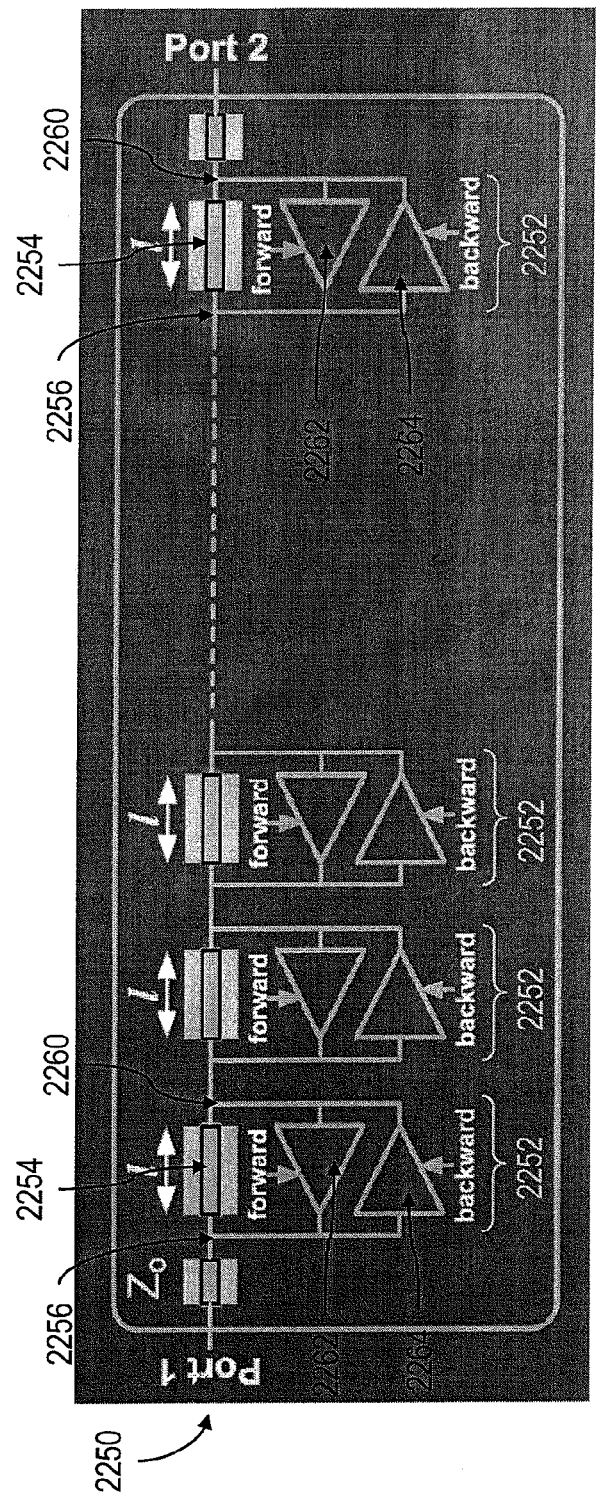
FIG. 22B is a circuit diagram showing an implementation of a bidirectional amplifier with multiple stages.

Another implementation of the current subject matter is shown in FIG. 22A and FIG. 22B. FIG. 22A shows a half-duplex radio transceiver 2200 that includes a duplexer 2202 to allow switching from a transmit path 2204 between a power amplifier (PA) 2206 and an antenna 2210 and a receive path 2212 between the antenna 2210 and a low noise amplifier (LNA) 2214. The duplexer 2202 typically incurs substantial losses.

An implementation of the current subject matter is shown in FIG. 22B. A device 2250 can include multiple bidirectional stages 2252 that are cascaded to provide the desired two-way gain without the need for a duplexer. Each bidirectional stage 2252 includes a transmission line segment 2254 between a first port 2256 and a second port 2260. Each bidirectional stage 2252 further includes a forward feedback path 2262 and a backward feedback path 2264, only one of which is in operation at a time. For amplification in the forward direction (for example from port 2 to port 1 in the device 2250), the backward feedback paths are active. For amplification in the reverse direction (for example from port 1 to port 2 in the device 2250), the forward feedback paths are active. A control signal provided by a control signal generator can be used to turn on or off either the forward feedback paths 2262 or the backward feedback paths 2264. When the backward feedback path 2264 is enabled, the forward feedback path 2262 is disabled and traveling waves are amplified from port 2 to port 1. Alternatively, the forward feedback path 2262 can be enabled and the backward feedback path 2264 disabled allowing for traveling wave amplification from port 1 to port 2. Each of the forward feedback path 2262 and the backward feedback path 2264 of each bidirectional stage 2252 can be a feedback stage according to the current subject matter. In one example, each of the forward feedback path 2262 and the backward feedback path 2264 can be similar to feedback stage 702 in FIG. 7. The backward feedback path 2264 is reversed relative to the forwards feedback path 2262.

While exemplary implementations of circuitry according to the current subject matter are described herein with reference to amplifier circuits, other circuits can also use this subject matter. For example, the subject matter described herein may be used for 60 GHz video transmission (e.g., SiBeam, Panasonic, MediaTek), 77 GHz radar applications (e.g., MaCOM, Infineon), and 80-90 GHz point-to-point wideband communication (e.g., Gigabeam). Moreover, the subject matter described herein may be extremely useful to provide systems using silicon-based chip technologies rather than the more expensive InP and GaAs technologies.

The subject matter described herein can be embodied in systems, apparatus, methods, and/or articles depending on the desired configuration. In particular, various implementations of the subject matter described herein can be realized in digital electronic circuitry, integrated circuitry, specially designed application specific integrated circuits (ASICs), computer hardware, combinations thereof, and the like.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flow depicted in the accompanying figures and/or described herein do not necessarily require the particular order shown, or sequential order, to achieve desirable results. Other implementations may be within the scope of the following claims.

The term "equation" is used broadly throughout this disclosure to refer to mathematical relationships, including both equalities and inequalities. Additionally, while many of the descriptions of illustrative implementations are discussed in terms applicable to heterojunction bipolar transistors, the subject matter of this disclosure can also be implemented using n-type metal-oxide-semiconductor (NMOS) and p-type metal-oxide-semiconductor (PMOS) transistors.

The invention claimed is:

1. An apparatus comprising:
a transmission line carrying a propagating signal along a direct path from an inlet port to an outlet port, the propagating signal comprising a forward traveling wave; and
a feedback stage that samples the propagating signal at the outlet port, generates a feedback signal that comprises a time translation and a gain translation, and routes the feedback signal to the inlet port, the time translation causing the gain translation to constructively interfere with the forward traveling wave, thereby increasing a forward traveling wave amplitude of the forward traveling wave.

2. An apparatus as in claim 1, wherein the gain translation, $A_v$, is given by $$A_v = g_m Z_0 / 2$$

where $g_m$ is a transconductance of the feedback stage and $Z_0$ is an impedance of the transmission line.

3. An apparatus as in claim 2, wherein the gain translation, $A_v$, is within a range of 0 to 0.5.

4. An apparatus as in claim 1, wherein the propagating signal further comprises a backward traveling wave, the time translation causing the gain translation to destructively interfere with the backward traveling wave, thereby reducing a backward traveling wave amplitude of the backward traveling wave.

5. An apparatus as in claim 1, wherein the feedback signal further comprises a frequency translation.

6. An apparatus as in claim 1, wherein the time translation of the feedback signal introduces a phase shift of approximately a quarter wavelength relative to the forward traveling wave.

7. An apparatus as in claim 1, wherein the transmission line introduces a first phase shift and the feedback stage introduces a second phase shift that sum to approximately 180 degrees.

8. An apparatus as in claim 7, wherein the first phase shift and the second phase shift are each in a range of approximately 50 to 130 degrees.

9. An apparatus as in claim 1, wherein the feedback stage comprises a common emitter and an emitter follower.

10. An apparatus as in claim 1, wherein the feedback stage comprises one or more transistors selected from a common emitter, a common source, an emitter follower, a source follower, a common base, and a common gate.

11. An apparatus as in claim 1, further comprising:
a second feedback stage that samples the propagating signal at the inlet port, generates a second feedback signal that comprises a second time translation and a second gain translation, and routes the second feedback signal to the outlet port, the second time translation causing the gain translation to constructively interfere with a second forward traveling wave of a second propagating signal carried by the transmission line along the direct path from the outlet inlet port to the inlet port, thereby increasing a second forward traveling wave amplitude; and
a control signal generator that inactivates the feedback stage when the second feedback stage is active and deactivates the second feedback stage when the feedback stage is active.

12. An apparatus comprising:
a first stage comprising:
a first transmission line carrying a propagating signal along a first direct path from a first inlet port to a first outlet port, the propagating signal comprising a forward traveling wave; and
a first feedback stage that samples the propagating signal at the first outlet port, generates a first feedback signal that comprises a first time translation and a first gain translation, and routes the first feedback signal to the first inlet port, the first time translation causing the first gain translation to constructively interfere with the forward traveling wave, thereby increasing a forward traveling wave amplitude through the first stage; and
a second stage comprising:
a second transmission line carrying the propagating signal along a second direct path from a second inlet port to a second outlet port, the second inlet port being directly connected to the first outlet port; and
a second feedback stage that samples the propagating signal at the second outlet port, generates a second feedback signal that comprises a second time translation and a second gain translation, and routes the second feedback signal to the second inlet port, the second time translation causing the second gain translation to constructively interfere with the forward traveling wave, thereby further increasing the forward traveling wave amplitude through the second stage.

13. A method comprising:
receiving, at an outlet port along a transmission line providing a direct path from an inlet port, a propagating signal comprising a forward traveling wave;
sampling the propagating signal at the outlet port in a feedback stage;
generating a feedback signal in the feedback stage, the feedback signal comprising a time translation and a gain translation; and
routing the feedback signal to the inlet port such that the time translation causes the gain translation to constructively interfere with the forward traveling wave, thereby increasing a forward traveling wave amplitude of the forward traveling wave.

14. A method as in claim 13, wherein the propagating signal further comprises a backward traveling wave, the method further comprising the time translation causes the gain translation to destructively interfere with the backward traveling wave, thereby decreasing a backward traveling wave amplitude of the backward traveling wave.

* * * * *